(12) United States Patent
Komiya et al.

(10) Patent No.: US 11,101,279 B2
(45) Date of Patent: Aug. 24, 2021

(54) SEMICONDUCTOR MEMORY DEVICE

(71) Applicant: TOSHIBA MEMORY CORPORATION, Minato-ku (JP)

(72) Inventors: Ken Komiya, Nagoya (JP); Takamasa Ito, Nagoya (JP); Naoki Yamamoto, Kuwana (JP); Yu Hirotsu, Kuwana (JP); Kazuhiro Tomishige, Yokkaichi (JP); Yoshinori Nakakubo, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/554,861

(22) Filed: Aug. 29, 2019

(65) Prior Publication Data

US 2020/0083239 A1 Mar. 12, 2020

(30) Foreign Application Priority Data

Sep. 6, 2018 (JP) .............................. JP2018-166581

(51) Int. Cl.
| | |
|---|---|
| *H01L 27/11556* | (2017.01) |
| *H01L 27/11519* | (2017.01) |
| *H01L 27/11565* | (2017.01) |
| *H01L 27/11582* | (2017.01) |
| *H01L 23/532* | (2006.01) |
| *H01L 21/02* | (2006.01) |
| *H01L 21/311* | (2006.01) |

(52) U.S. Cl.
CPC .. *H01L 27/11556* (2013.01); *H01L 23/53295* (2013.01); *H01L 27/11519* (2013.01); *H01L 27/11565* (2013.01); *H01L 27/11582* (2013.01); *H01L 21/0217* (2013.01); *H01L 21/02211* (2013.01); *H01L 21/02271* (2013.01); *H01L 21/31111* (2013.01)

(58) Field of Classification Search
CPC ..................... H01L 27/11556; H01L 27/11582
See application file for complete search history.

(56) References Cited

U.S. PATENT DOCUMENTS

| | | | |
|---|---|---|---|
| 9,806,091 B2 | 10/2017 | Miyagawa et al. | |
| 2017/0207236 A1* | 7/2017 | Kitamura | .............. H01L 21/486 |

FOREIGN PATENT DOCUMENTS

JP        6542149 B2     7/2019

* cited by examiner

*Primary Examiner* — Farun Lu
(74) *Attorney, Agent, or Firm* — Oblon, McClelland, Maier & Neustadt, L.L.P.

(57) ABSTRACT

A semiconductor memory device includes: a substrate including a first and a second regions; first wiring layers disposed in a first direction; a second wiring layer; a third wiring layer closer to the substrate than the first and the second wiring layers; a semiconductor film that penetrates the first and the second wiring layers, and is connected to the third wiring layer; and a gate insulating film disposed between the semiconductor film and the first wiring layers. The first wiring layers include first conductive films opposed to the semiconductor film in the first region, and first films in the second region. The second wiring layer includes a second conductive film opposed to the semiconductor film in the first region, and a second film in the second region. The second film is different from the first films.

10 Claims, 43 Drawing Sheets

SEMICONDUCTOR MEMORY DEVICE

CROSS-REFERENCE TO RELATED APPLICATIONS

This application is based upon and claims the benefit of Japanese Patent Application No. 2018-166581, filed on Sep. 6, 2018, the entire contents of which are incorporated herein by reference.

BACKGROUND

Field

Embodiments described herein relate generally to a semiconductor memory device.

Description of the Related Art

There has been known a semiconductor memory device that includes a substrate, a plurality of wiring layers disposed in a first direction intersecting with a surface of the substrate, and a memory structure penetrating the plurality of wiring layers and extending in the first direction.

DETAILED DESCRIPTION

Figure 1:
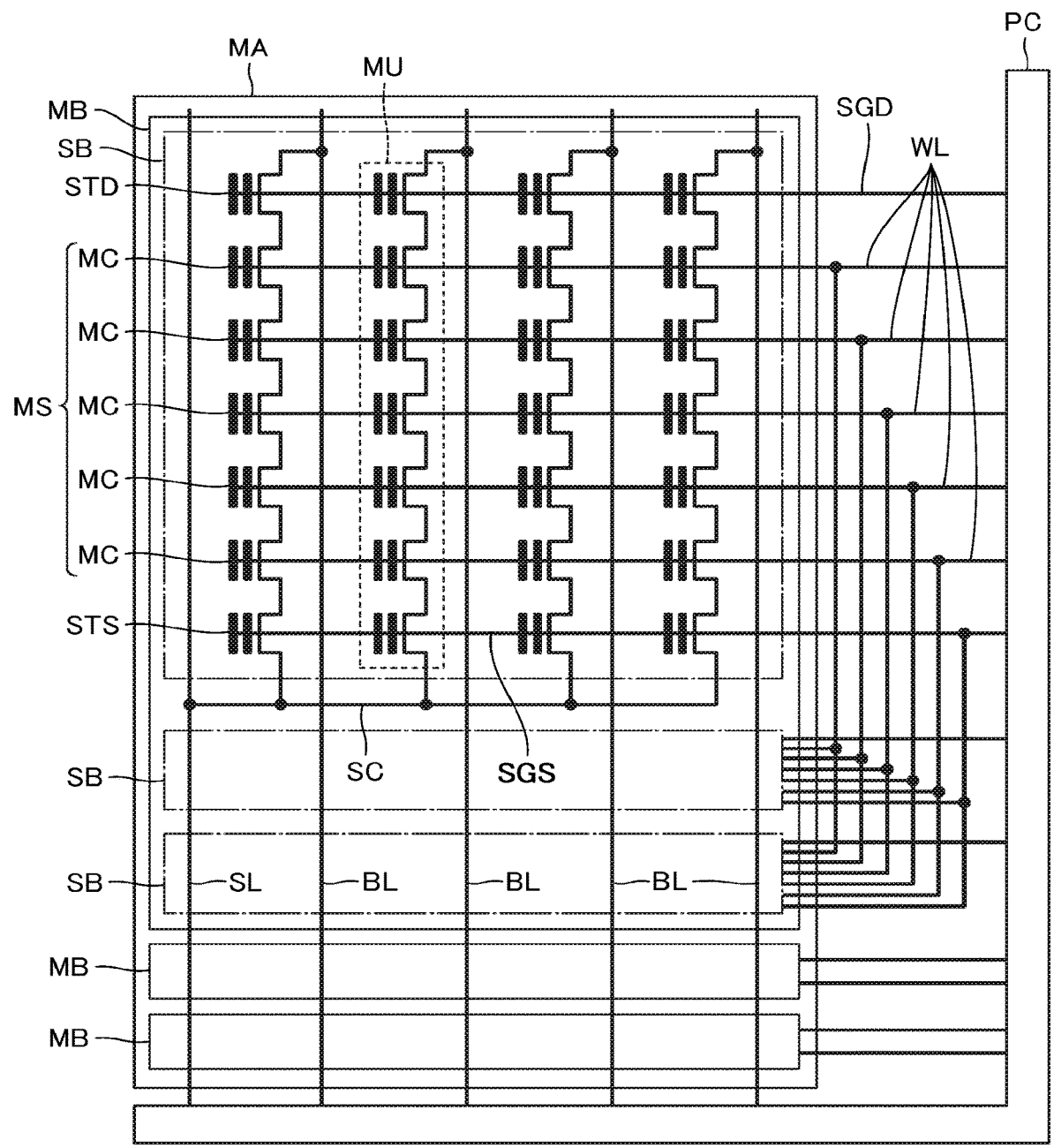
FIG. 1 is a schematic equivalent circuit diagram of a semiconductor memory device according to a first embodiment.

A semiconductor memory device according to one embodiment includes: a substrate that includes a first region and a second region; a plurality of first wiring layers disposed in a first direction intersecting with a surface of the substrate; a second wiring layer having a distance from the substrate different from distances of the plurality of first wiring layers from the substrate; a third wiring layer close to the substrate with respect to the plurality of first wiring layers and the second wiring layer; a semiconductor film that penetrates the plurality of first wiring layers and the second wiring layer, extends in the first direction, and is connected to the third wiring layer; and a gate insulating film disposed between the semiconductor film and the first wiring layers. The first wiring layers include first conductive films opposed to the semiconductor film in the first region, and the first wiring layers include first films different from the first conductive films in the second region. The second wiring layer includes a second conductive film opposed to the semiconductor film in the first region, and the second wiring layer includes a second film different from the second conductive film in the second region. The second film is different from the first films.

A semiconductor memory device according to one embodiment includes: a substrate that includes a first region and a second region; a plurality of first wiring layers disposed in a first direction intersecting with a surface of the substrate; a second wiring layer close to the substrate with respect to the plurality of first wiring layers; a semiconductor film that penetrates the plurality of first wiring layers, extends in the first direction, and is connected to the second wiring layer; and a gate insulating film disposed between the semiconductor film and the first wiring layers. The first wiring layers include first conductive films opposed to the semiconductor film in the first region, and the first wiring layers include first films different from the first conductive films in the second region. The second wiring layer includes a laminated film having a conductive property including a second conductive film and a third conductive film in the first region, and the second wiring layer includes a second film different from the second conductive film and the third conductive film in the second region, and the second film is different from the first films.

A semiconductor memory device according to one embodiment includes: a substrate; a plurality of first wiring layers disposed in a first direction intersecting with a surface of the substrate; a second wiring layer close to the substrate with respect to the plurality of first wiring layers, the second wiring layer including a laminated film having a conductive property; a semiconductor film that penetrates the plurality of first wiring layers, extends in the first direction, and is connected to the second wiring layer; a gate insulating film disposed between the semiconductor film and the first wiring layers; a first insulating film disposed between the plurality of first wiring layers and the second wiring layer, the first insulating film containing oxygen; a second insulating film disposed between the first insulating film and the plurality of first wiring layers, the second insulating film containing nitrogen; and a third insulating film disposed between the second insulating film and the plurality of first wiring layers, the third insulating film containing oxygen.

Next, the semiconductor memory devices according to embodiments are described in detail with reference to the accompanying drawings. The following embodiments are only examples, and are not described for the purpose of limiting the present invention.

In this specification, a direction intersecting with a surface of a substrate is referred to as a first direction, a direction intersecting with the first direction is referred to as a second direction, and a direction intersecting with the first direction and the second direction is referred to as a third direction. A predetermined direction parallel to the surface of the substrate is referred to as an X direction, a direction parallel to the surface of the substrate and perpendicular to the X direction is referred to as a Y direction, and a direction perpendicular to the surface of the substrate is referred to as a Z direction. The following description exemplifies a case where the X direction, the Y direction, and the Z direction correspond to the third direction, the second direction, and the first direction, respectively. Note that the first direction, the second direction, and the third direction are not limited to the Z direction, the Y direction, and the X direction.

Expressions such as "above" and "below" in this specification are based on the substrate. For example, a direction away from the substrate along the first direction is referred to as above and a direction approaching the substrate along the first direction is referred to as below. A lower surface and a lower end of a certain configuration mean a surface and an end portion on the substrate side of this configuration. A top surface and an upper end of a certain configuration mean a surface and an end portion on a side opposite to the substrate of this configuration. A surface intersecting with the second direction or the third direction is referred to as a side surface.

First Embodiment

[Configuration]

FIG. 1 is a schematic equivalent circuit diagram of a semiconductor memory device according to the first embodiment. For sake of convenience of description, FIG. 1 omits a part of a configuration.

The semiconductor memory device according to the embodiment includes a memory cell array MA and a peripheral circuit PC controlling the memory cell array MA.

The memory cell array MA includes a plurality of memory blocks MB. The plurality of memory blocks MB each include a plurality of sub-blocks SB. The plurality of sub-blocks SB each include a plurality of memory units MU. The plurality of memory units MU each have one end connected to the peripheral circuit PC via a bit line BL. The plurality of memory units MU each have the other end connected to the peripheral circuit PC via a common lower wiring SC and source line SL.

The memory unit MU includes a drain select transistor STD, a memory string MS, and a source select transistor STS, which are connected in series between the bit line BL and the lower wiring SC. Hereinafter, the drain select transistor STD and the source select transistor STS may be simply referred to as select transistors (STD, STS).

The memory string MS includes a plurality of memory cells MC connected in series. The memory cell MC is a field-effect type transistor including a semiconductor film, a gate insulating film, and a gate electrode. The semiconductor film functions as a channel region. The gate insulating film includes a memory unit that can store data. This memory unit is, for example, an electric charge accumulating film such as a silicon nitride film (SiN) and a floating gate. In this case, the memory cell MC has a threshold voltage that varies corresponding to an electric charge amount in the electric charge accumulating film. The gate electrode is connected to a word line WL. The word lines WL are disposed corresponding to the plurality of memory cells MC belonging to one memory string MS and are connected to all the memory strings MS in one memory block MB in common.

The select transistor (STD, STS) is a field-effect type transistor including a semiconductor film, a gate insulating film, and a gate electrode. The semiconductor film functions as a channel region. The gate electrode of the drain select transistor STD is connected to a drain select line SGD. The drain select line SGD is disposed corresponding to the sub-block SB and connected to all the drain select transistors STD in one sub-block SB in common. The gate electrode of the source select transistor STS is connected to a source select line SGS. The source select line SGS is connected to all the source select transistors STS in one memory block MB in common.

The peripheral circuit PC generates voltages required to, for example, a read operation, a write operation, and an erase operation and applies the voltages to the bit line BL, the source line SL, the word line WL, and the select gate line (SGD, SGS). The peripheral circuit PC, for example, includes a plurality of transistors and wirings disposed on a chip identical to the memory cell array MA.

Figure 2:
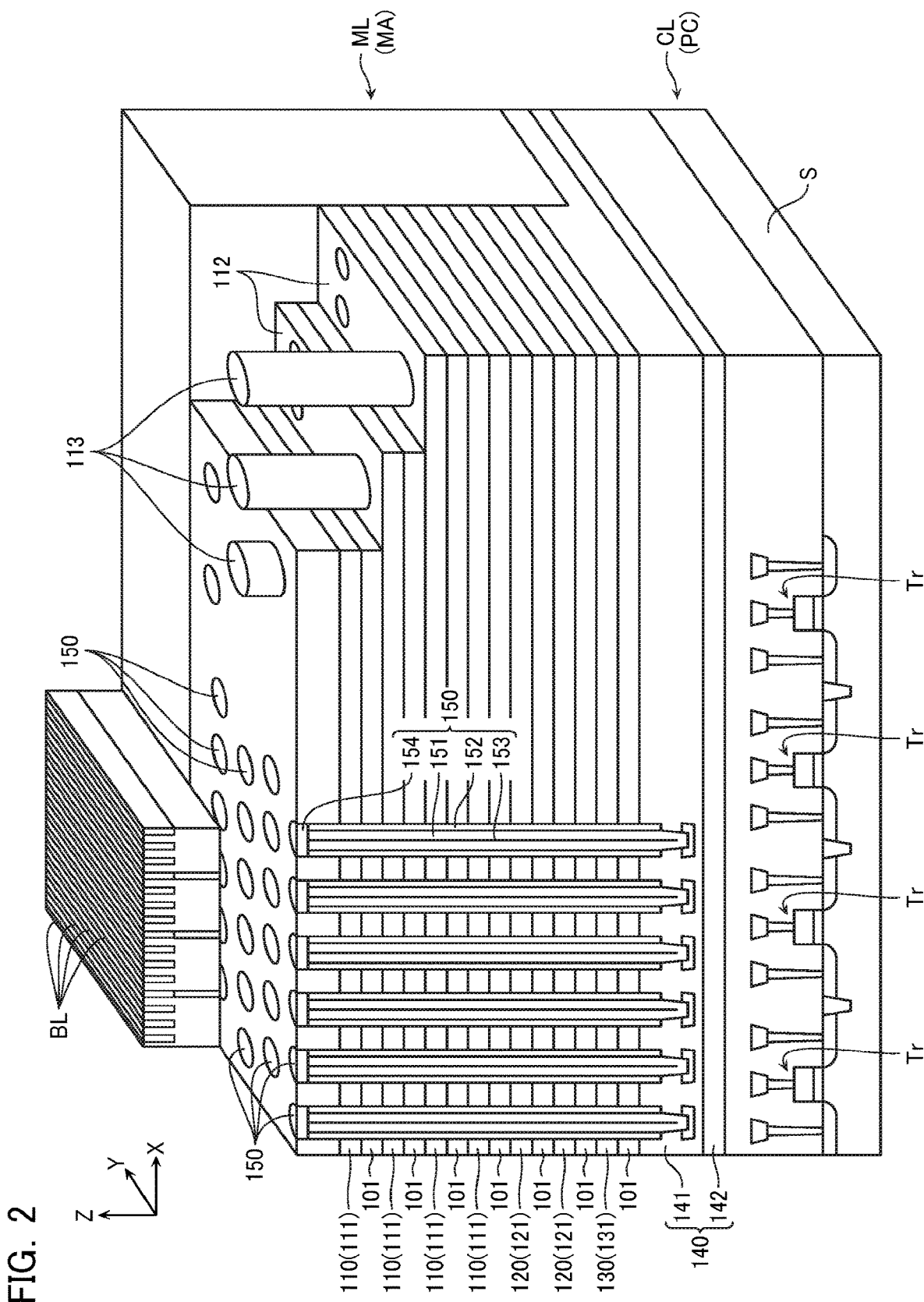
FIG. 2 is a schematic perspective view illustrating a configuration of a part of the semiconductor memory device.

FIG. 2 is a schematic perspective view of the semiconductor memory device according to the embodiment. For sake of convenience of explanation, FIG. 2 omits a part of a configuration.

As illustrated in FIG. 2, the semiconductor memory device according to the embodiment includes a substrate S, a circuit layer CL disposed on the substrate S, and a memory cell array layer ML disposed above the circuit layer CL.

The substrate S is, for example, a semiconductor substrate made of, for example, single-crystal silicon (Si).

For example, the substrate S has a double well structure including an n-type impurity layer on a surface of a semiconductor substrate and further including a p-type impurity layer in this n-type impurity layer.

The circuit layer CL includes a plurality of transistors Tr constituting the peripheral circuit PC (FIG. 1) and a plurality of wirings and contacts connected to the plurality of transistors Tr. The transistor Tr is, for example, a field-effect type transistor using the surface of the substrate S as a channel region (gate region).

The memory cell array layer ML includes a plurality of configurations included in the memory cell array MA (FIG. 1). The memory cell array layer ML includes a plurality of wiring layers 110 disposed in the Z direction, a plurality of wiring layers 120 disposed below these wiring layers 110, a wiring layer 130 disposed below these wiring layers 120, and a wiring layer 140 disposed below the wiring layer 130. Between these configurations, interlayer insulating films 101 such as silicon oxide ($SiO_2$) are disposed. Additionally, the memory cell array layer ML includes a plurality of memory structures 150 extending in the Z direction penetrating the plurality of wiring layers 110, the plurality of wiring layers 120, the wiring layer 130, and the plurality of interlayer insulating films 101 and have lower ends connected to the wiring layer 140.

The wiring layers 110, 120, and 130 include conductive films 111, 121, and 131, respectively. The conductive films 111 function as the word lines WL (FIG. 1) and gate electrodes of the plurality of memory cells MC connected to these word lines WL or the drain select line SGD (FIG. 1) and gate electrodes of the plurality of drain select transistors STD (FIG. 1) connected to this drain select line SGD. The plurality of conductive films 121 function as the word lines WL (FIG. 1) and gate electrodes of the plurality of memory cells MC connected to these word lines WL. The conductive film 131 functions as the source select line SGS (FIG. 1) and gate electrodes of the plurality of source select transistors STS (FIG. 1) connected to this source select line SGS. The conductive films 111, 121, and 131 have a plurality of through-holes formed in a predetermined pattern inside of which the memory structures 150 are located. The conductive film 111 includes contact portions 112 in the end portion in the X direction. The contact portion 112 is connected to a contact 113 extending in the Z direction.

The wiring layer 140 includes a conductive film 141 connected to the memory structures 150 and a conductive film 142 disposed on the lower surface of the conductive film 141. The conductive film 141 is, for example, a semiconductor film having a conductive property such as polysilicon containing N-type impurities such as phosphorus (P). The conductive film 142 may be, for example, a semiconductor film having a conductive property such as polysilicon containing N-type impurities such as phosphorus (P), may be a metal film such as tungsten (W), or may be silicide or a similar substance.

The plurality of memory structures 150 are disposed in the X direction and the Y direction and each function as the memory unit MU (FIG. 1). The memory structure 150 includes a semiconductor film 151 extending in the Z direction and a gate insulating film 152 disposed between the semiconductor film 151 and the conductive films 111 and 121.

The semiconductor films 151 function as channel regions of the plurality of memory cells MC, the drain select transistor STD, and the source select transistor STS included in one memory unit MU (FIG. 1). The semiconductor film 151 is, for example, a semiconductor layer such as non-doped polycrystalline silicon (p-Si). An insulating film 153 such as silicon oxide ($SiO_2$) is embedded into the center part of the semiconductor film 151. The semiconductor film 151 has a lower end portion connected to the conductive film 141. The semiconductor film 151 has an upper end connected to the bit line BL via a semiconductor film 154. The semiconductor film 154 is, for example, a semiconductor film having a conductive property into which n-type impurities such as phosphorus (P) are injected.

The gate insulating film 152 includes an electric charge accumulating film disposed between the semiconductor film 151 and the conductive films 111 and 121, a tunnel insulating film disposed between this electric charge accumulating film and the semiconductor film 151, and a block insulating film disposed between this electric charge accumulating layer and the conductive films 111 and 121. The electric charge accumulating film may be, for example, an insulating film such as silicon nitride (SiN) or may have, for example, floating gates having a conductive property. The tunnel insulating film and the block insulating film may be, for example, insulating films such as silicon oxide ($SiO_2$) or may be laminated films having an insulating property.

Next, with reference to FIG. 3 to FIG. 8, the further detailed configurations of the memory cell array MA are described. For sake of convenience of explanation, FIG. 3 to FIG. 8 omit a part of the configuration.

Figure 3:
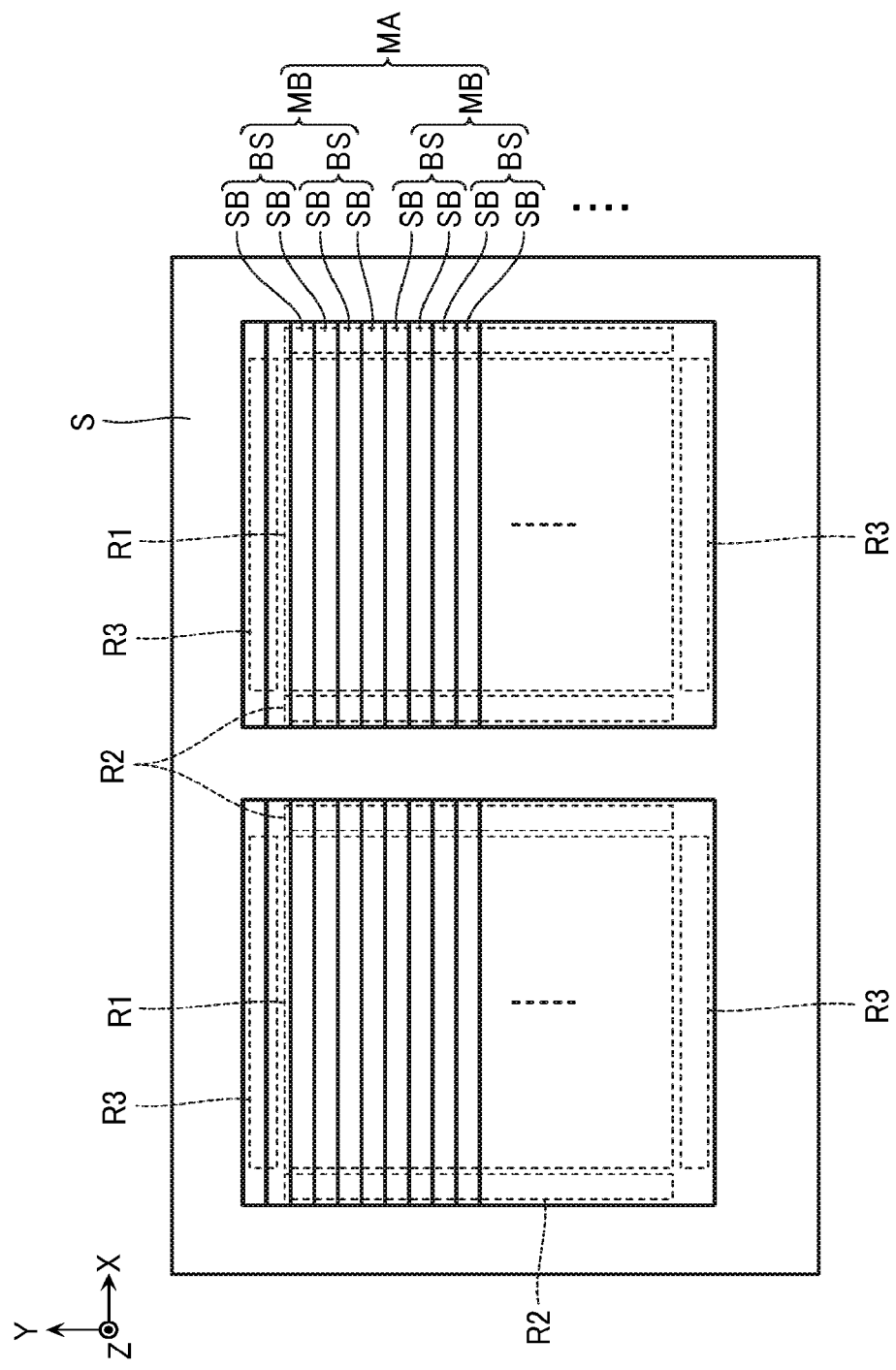
FIG. 3 is a schematic plan view illustrating a configuration of a part of the semiconductor memory device.

FIG. 3 is a schematic plan view of the semiconductor memory device according to the embodiment.

As illustrated in FIG. 3, the plurality of memory cell arrays MA are disposed on the substrate S. In the example illustrated in the drawing, the two memory cell arrays MA are arrayed in the X direction on the substrate S. The memory cell array MA includes the plurality of memory blocks MB disposed in the Y direction. The plurality of memory blocks MB include a plurality of block structures BS disposed in the Y direction. The plurality of block structures BS include the plurality of sub-blocks SB disposed in the Y direction.

The memory cell array MA includes a region R1 in which the memory cells MC are disposed, regions R2 in which the contacts 113 and the like are disposed, and regions R3 that connect the bit lines BL to the transistors Tr and the like.

Figure 4:
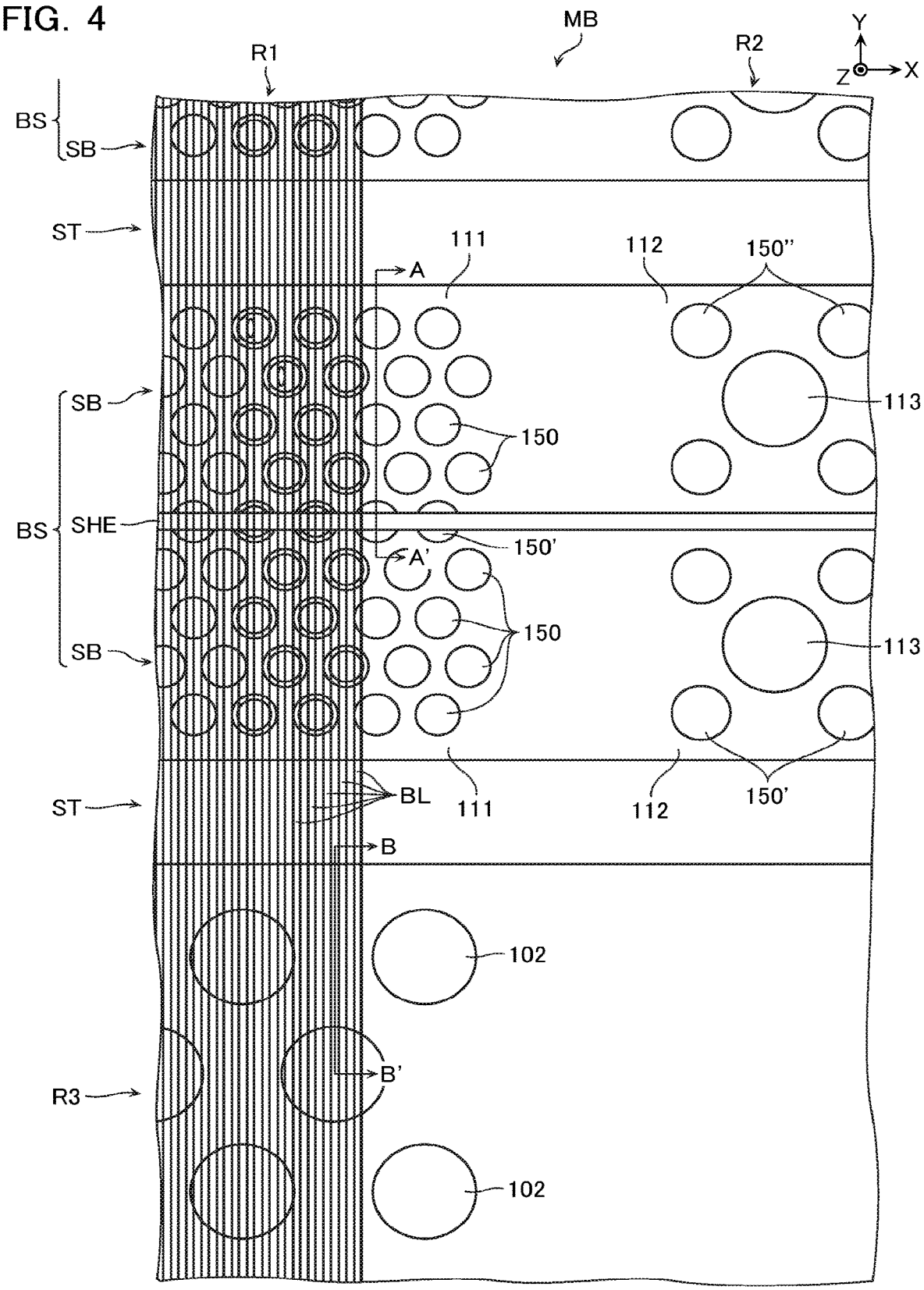
FIG. 4 is an enlarged view of a part of FIG. 3.

FIG. 4 is an enlarged view of a part of FIG. 3 and illustrates a part of the regions R1, R2, and R3.

In the region R1, the memory blocks MB each include the two block structures BS adjacent in the Y direction via an insulating portion ST. The block structures BS each include the two sub-blocks SB adjacent in the Y direction via an insulating portion SHE. In each sub-block SB, the plurality of memory structures 150 are disposed in a staggered pattern. The plurality of memory structures 150 are connected to the respective bit lines BL and function as the memory units MU (FIG. 1). Between the two sub-blocks SB adjacent in the Y direction, dummy structures 150' having structures similar to those of the memory structures 150 are disposed. The dummy structures 150' are disposed in the X direction along the insulating portion SHE.

The region R2 includes the contact portions 112 in the conductive films 111. At each of the contact portions 112, the contact 113 is provided. Dummy structures 150" having structures similar to those of the memory structures 150 are disposed at the proximity of the contact 113. The dummy structures 150" are disposed, for example, so as to surround the contact 113.

The region R3 includes the plurality of contacts 102 connected to the bit lines BL.

Figure 5:
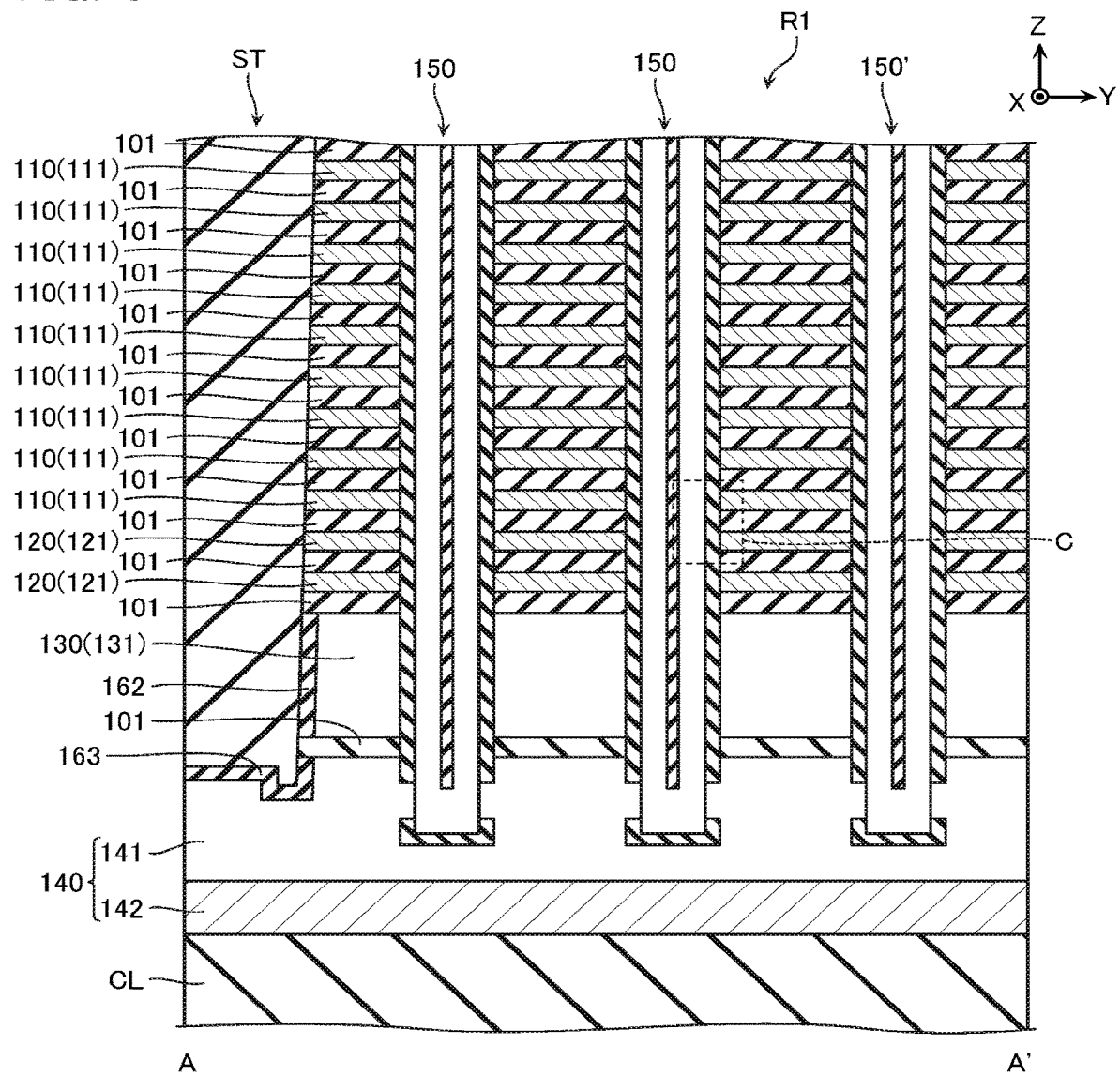
FIG. 5 is a schematic cross-sectional view corresponding to the line A-A' of FIG. 4.
Figure 6:
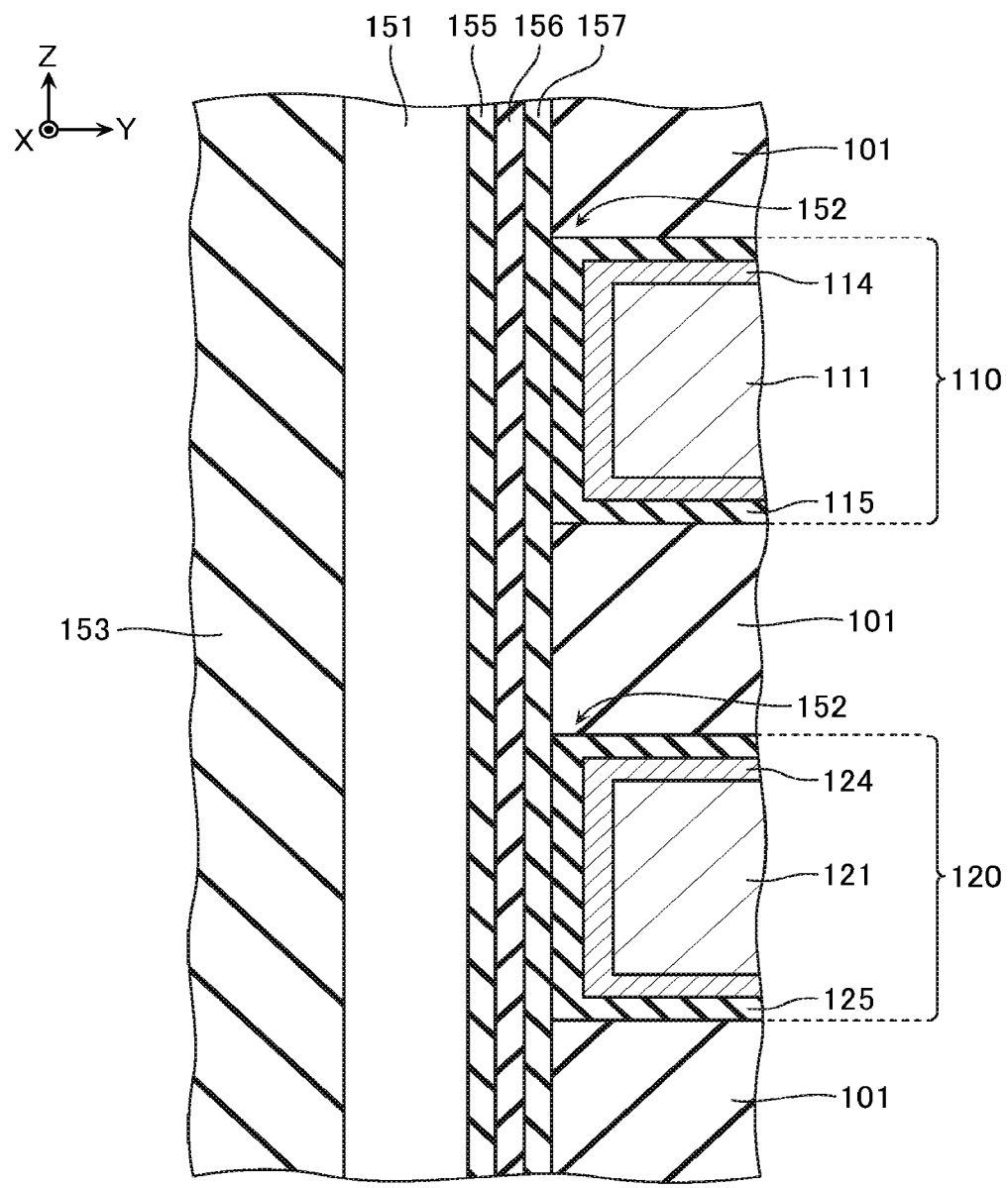
FIG. 6 is an enlarged view of a part indicated by C of FIG. 5.

FIG. 5 is a schematic cross-sectional view taking the structure illustrated in FIG. 4 along the line A-A' and viewed in the arrow direction and illustrates the structure in the region R1. FIG. 6 is an enlarged view of a part indicated by C in FIG. 5.

As illustrated in FIG. 6, the wiring layer 110 includes the conductive film 111, a barrier metal film 114 that covers a top surface, a lower surface, and a side surface of this conductive film 111, and a high-dielectric insulating film 115 that covers a top surface, a lower surface, and a side surface of this barrier metal film 114. The conductive film 111 is, for example, a metal film such as tungsten (W). The barrier metal film 114 is, for example, a metal film such as titanium nitride (TiN). The high-dielectric insulating film 115 is, for example, a metal oxide film such as alumina ($Al_2O_3$).

The wiring layer 120 includes the conductive film 121, a barrier metal film 124 that covers a top surface, a lower surface, and a side surface of this conductive film 121, and a high-dielectric insulating film 125 that covers a top surface, a lower surface, and a side surface of this barrier metal film 124. The conductive film 121 is, for example, a metal film such as tungsten (W). The barrier metal film 124 is, for example, a metal film such as titanium nitride. The high-dielectric insulating film 125 is, for example, a metal oxide film such as alumina.

The gate insulating film 152 includes a tunnel insulating film 155 such as $SiO_2$, an electric charge accumulating film 156 such as silicon nitride (SiN), a block insulating film 157 such as $SiO_2$, and the high-dielectric insulating films 115 and 125. The tunnel insulating film 155, the electric charge accumulating film 156, and the block insulating film 157 are formed into approximately cylindrical shapes and extend in the Z direction along the outer peripheral surface of the semiconductor film 151.

Figure 7:
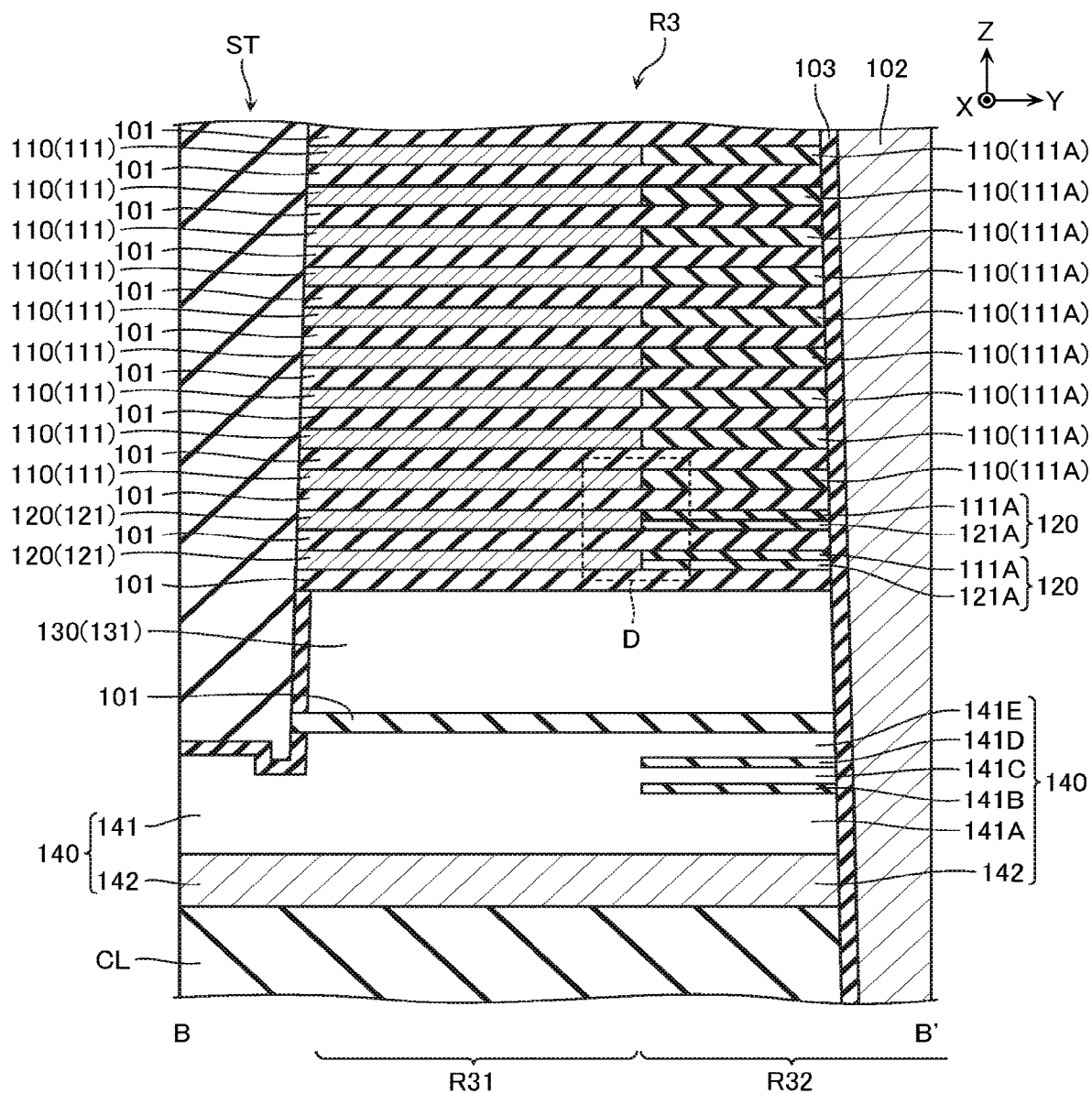
FIG. 7 is a schematic cross-sectional view corresponding to the line B-B' of FIG. 4.
Figure 8:
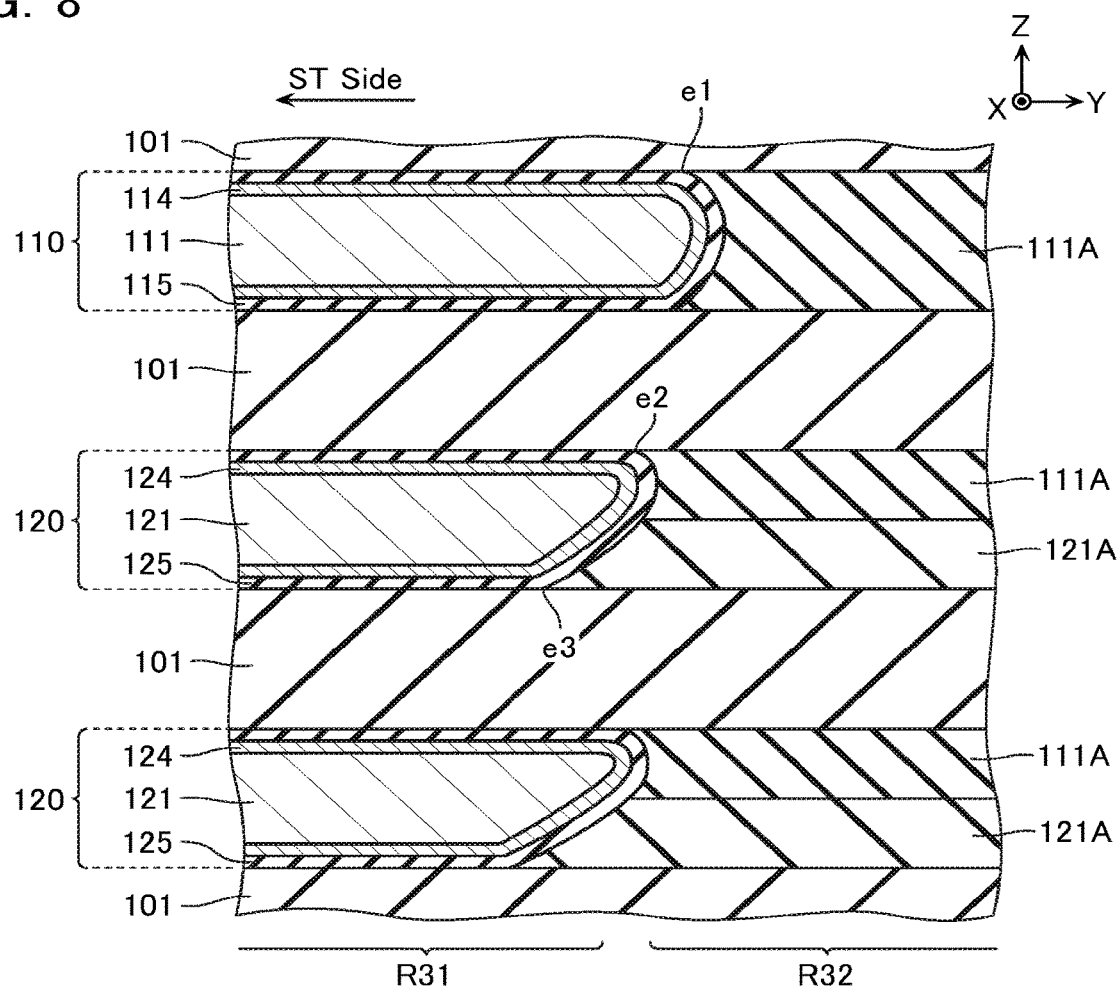
FIG. 8 is an enlarged view of a part indicated by D of FIG. 7.

FIG. 7 is a schematic cross-sectional view taken the structure illustrated in FIG. 4 along the line B-B' and viewed in the arrow direction and illustrates a structure in the region R3. FIG. 8 is an enlarged view of a part indicated by D in FIG. 7.

In the wiring layers 110, the conductive films 111 are disposed in a region R31 where a distance from the insulating portion ST (FIG. 7) is equal to or less than a predetermined distance. On the other hand, insulating films 111A are disposed in a region R32 where a distance from the insulating portion ST is equal to or more than the predetermined distance. As illustrated in FIG. 8, the barrier metal film 114 and the high-dielectric insulating film 115 are disposed on the top surface, the lower surface, and the side surface of the conductive film 111 in the region R31. On the other hand, a single-layer film of the insulating film 111A of silicon nitride (SiN) or the like is disposed in the region R32. The insulating film 111A has a top surface and a lower surface in contact with the interlayer insulating films 101 and a side surface in contact with the high-dielectric insulating film 115.

In the wiring layer 120, the conductive film 121 is disposed in the region R31. On the other hand, the insulating film 111A and an insulating film 121A are disposed in the region R32. As illustrated in FIG. 8, the barrier metal film 124 and the high-dielectric insulating film 125 are disposed on the top surface, the lower surface, and the side surface of the conductive film 121 in the region R31. On the other hand, in the region R32, a laminated film including the insulating film 121A of silicon nitride (SiN) or the like and the insulating film 111A disposed on the top surface of this insulating film 121A are disposed. The lower surface of the insulating film 121A and the top surface of the insulating film 111A are in contact with the interlayer insulating films 101, and the side surfaces of these films are in contact with the high-dielectric insulating film 125.

In the example illustrated in the drawing, both of the insulating film 111A and the insulating film 121A are insulating films made of silicon nitride or the like. However, the insulating film 121A has a density larger than a density of the insulating film 111A. The insulating film 121A has a content rate of hydrogen (H) smaller than a content rate of hydrogen in the insulating film 111A. Regarding an etching rate of phosphoric acid, the insulating film 111A is larger than the insulating film 121A. The insulating film 111A and the insulating film 121A can be distinguished by, for example, a Transmission Electron Microscope (TEM).

In the example illustrated in FIG. 8, an end portion e1 on the insulating portion ST side of the insulating film 111A in the wiring layer 110 is far from the insulating portion ST with respect to an end portion e2 on the insulating portion ST side of the insulating film 111A in the wiring layer 120. This end portion e2 is far from the insulating portion ST with respect to an end portion e3 on the insulating portion ST side of the insulating film 121A in the wiring layer 120.

As illustrated in FIG. 7, the wiring layer 140 includes the conductive film 141 and the conductive film 142 in the region R31. On the other hand, in the region R32, the conductive film 142, a semiconductor film 141A made of silicon or the like disposed on the conductive film 142, an insulating film 141B of silicon oxide or the like, a semiconductor film 141C of silicon or the like, an insulating film 141D of silicon oxide or the like, and a semiconductor film 141E of silicon or the like are disposed.

[Manufacturing Method]

Next, with reference to FIG. 9 to FIG. 32, the method for manufacturing the semiconductor memory devices according to the embodiments is described.

Figure 9:
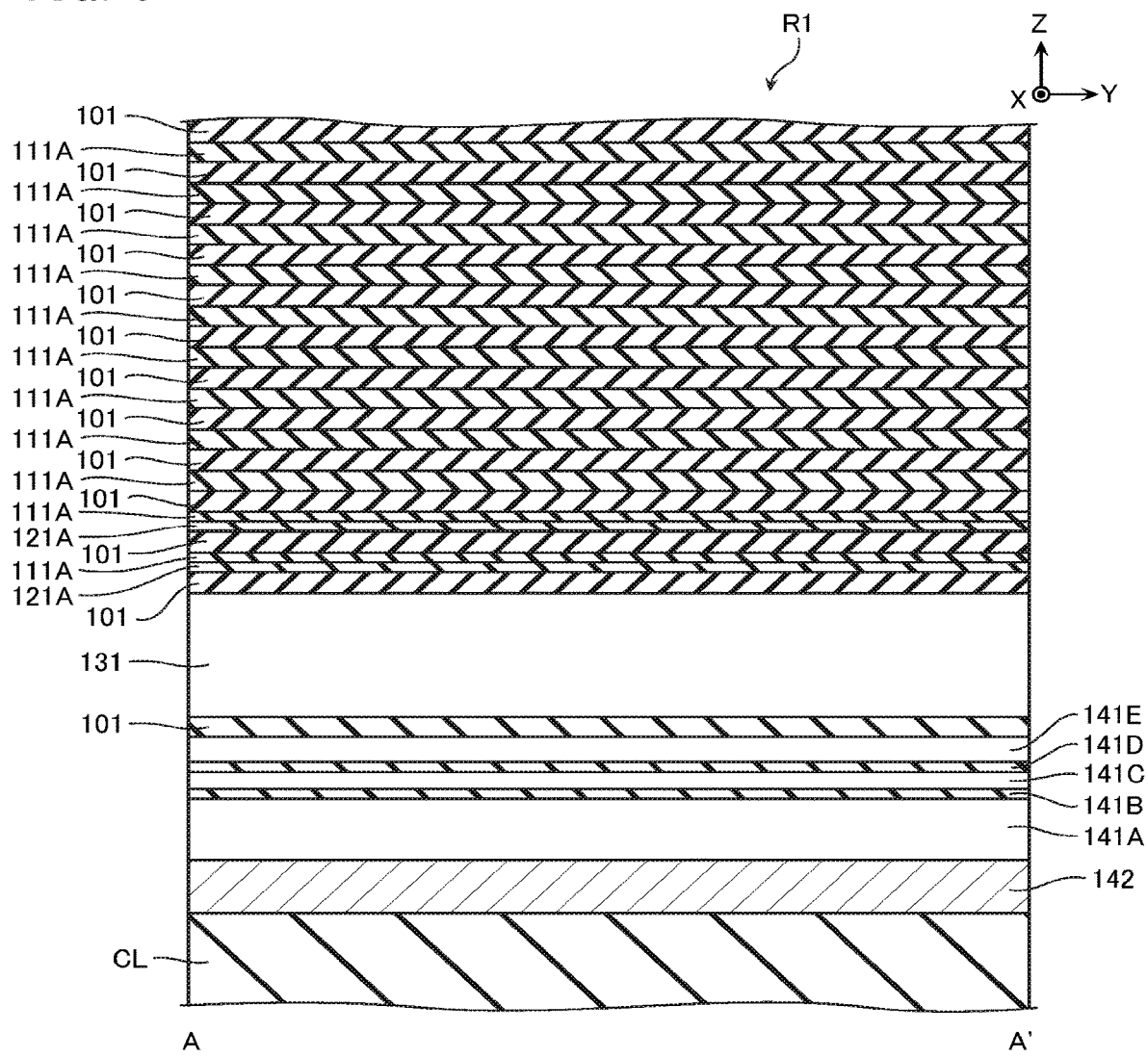
FIG. 9 is a schematic cross-sectional view illustrating a method for manufacturing the semiconductor memory device.

As illustrated in FIG. 9, the manufacturing method forms the conductive film 142, the semiconductor film 141A, the insulating film 141B, the semiconductor film 141C, the insulating film 141D, and the semiconductor film 141E on the circuit layer CL. The interlayer insulating film 101 and the conductive film 131 are formed above these films. The interlayer insulating films 101, the insulating films 121A, and the insulating films 111A are formed above these films in the order. The plurality of interlayer insulating films 101 and insulating films 111A are formed in alternation. This process is, for example, performed by a method such as Chemical Vapor Deposition (CVD). The insulating film 111A is, for example, formed by a method such as a plasma CVD. The insulating film 121A is, for example, formed by a method such as Low Pressure Chemical Vapor Deposition (LPCVD) using dichlorosilane.

Figure 10:
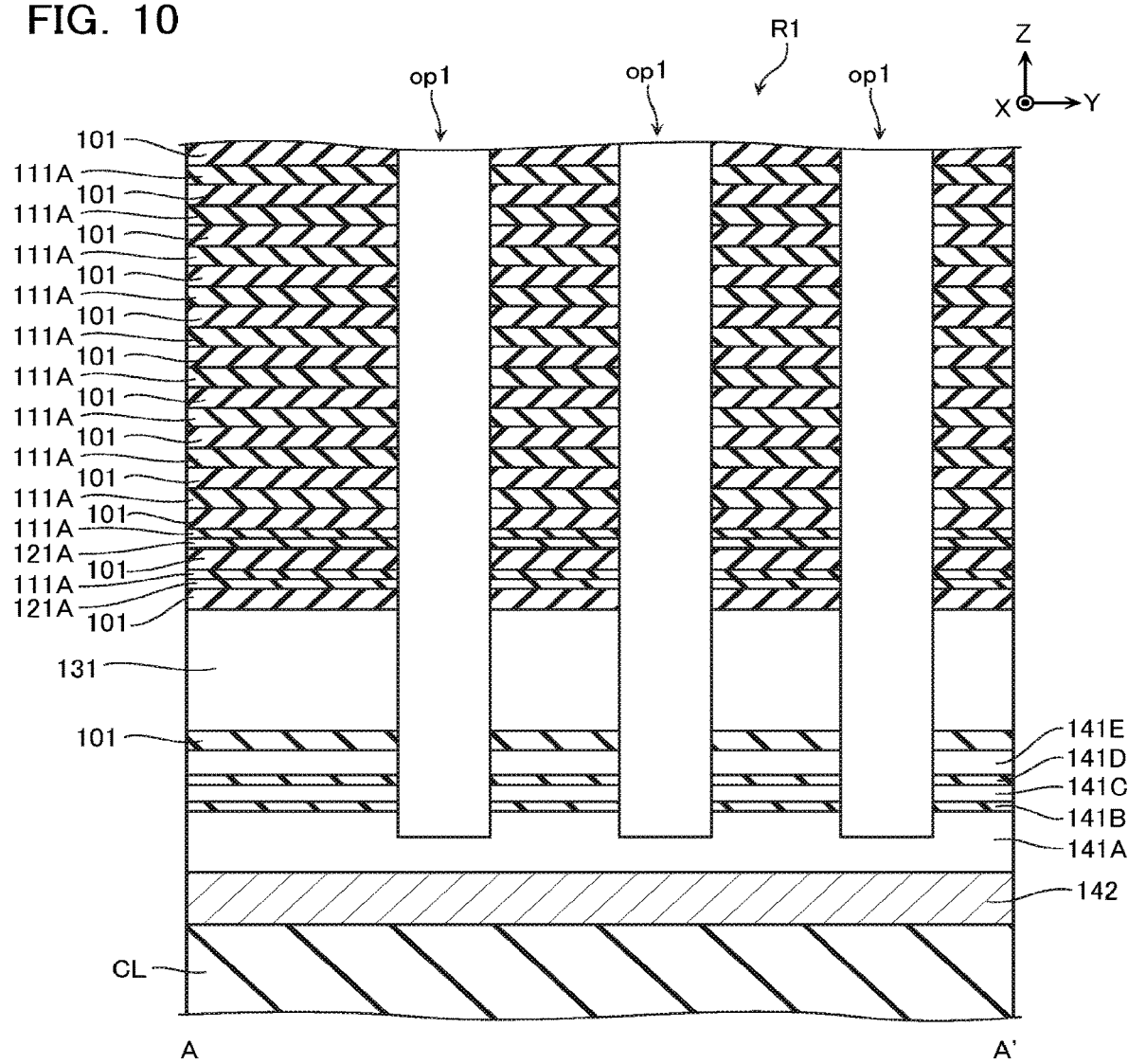
FIG. 10 is a schematic cross-sectional view illustrating the manufacturing method.

Next, as illustrated in FIG. 10, openings op1 are formed. The opening op1 is an opening that extends in the Z direction, penetrates the insulating films 111A, the insulating films 121A, the conductive film 131, the interlayer insulating films 101, the semiconductor film 141E, the insulating film 141D, the semiconductor film 141C, and the insulating film 141B to expose the semiconductor film 141A. This process is, for example, performed by a method such as Reactive Ion Etching (RIE).

Figure 11:
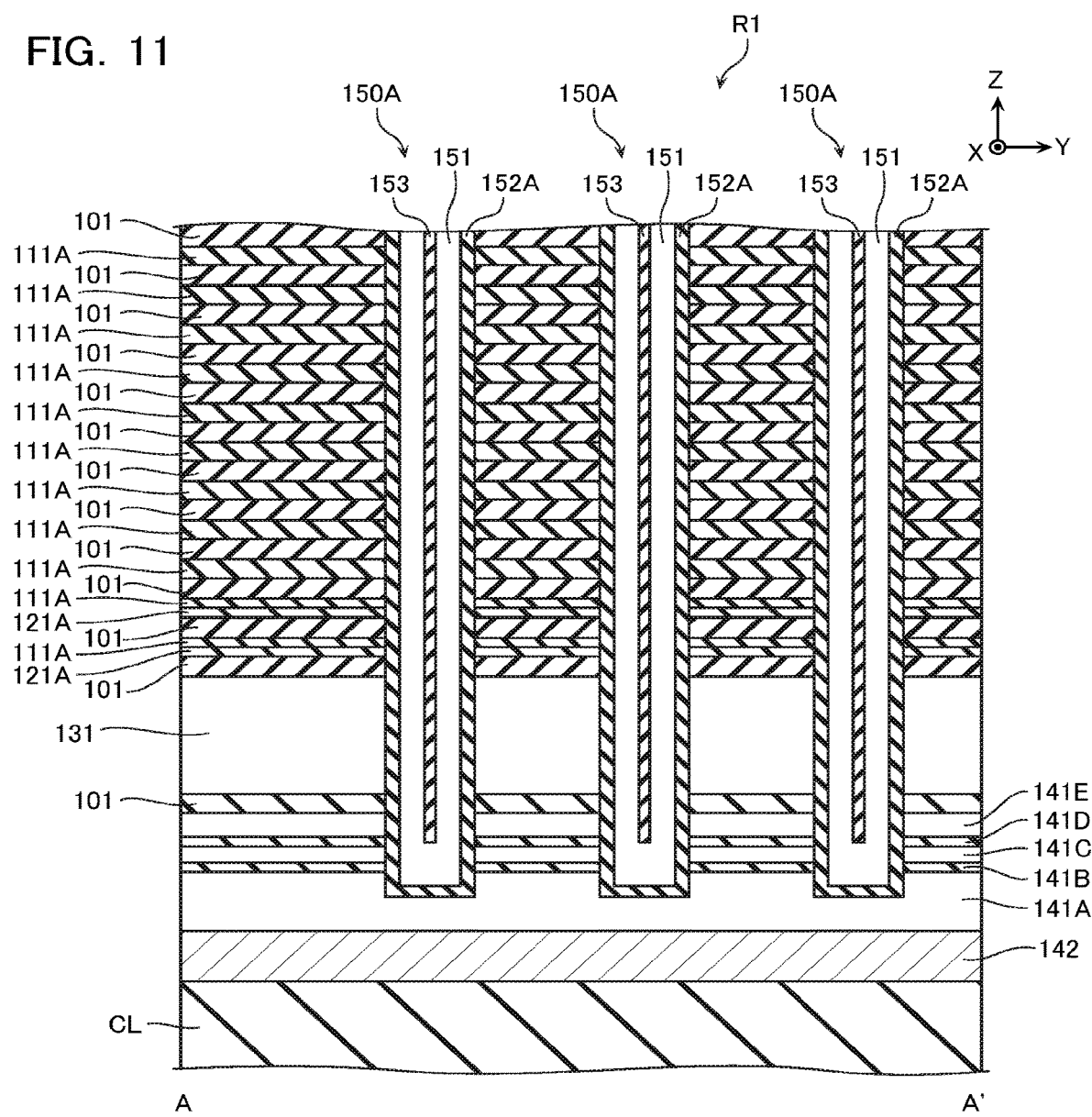
FIG. 11 is a schematic cross-sectional view illustrating the manufacturing method.

Next, as illustrated in FIG. 11, structures 150A including laminated films 152A having an insulating property, semiconductor films 151, and insulating films 153 are formed in inner peripheral surfaces of the openings op1. The laminated film 152A having the insulating property is a film that constitutes a part of or all of the gate insulating film 152 and is a laminated film including the block insulating film 157, the electric charge accumulating film 156, and the tunnel insulating film 155, which have been described with reference to FIG. 6 and the like, in the embodiment. This process is, for example, performed by a method such as CVD. This process, for example, performs a heat treatment or a similar treatment to modify a crystalline structure of the semiconductor film 151.

Figure 12:
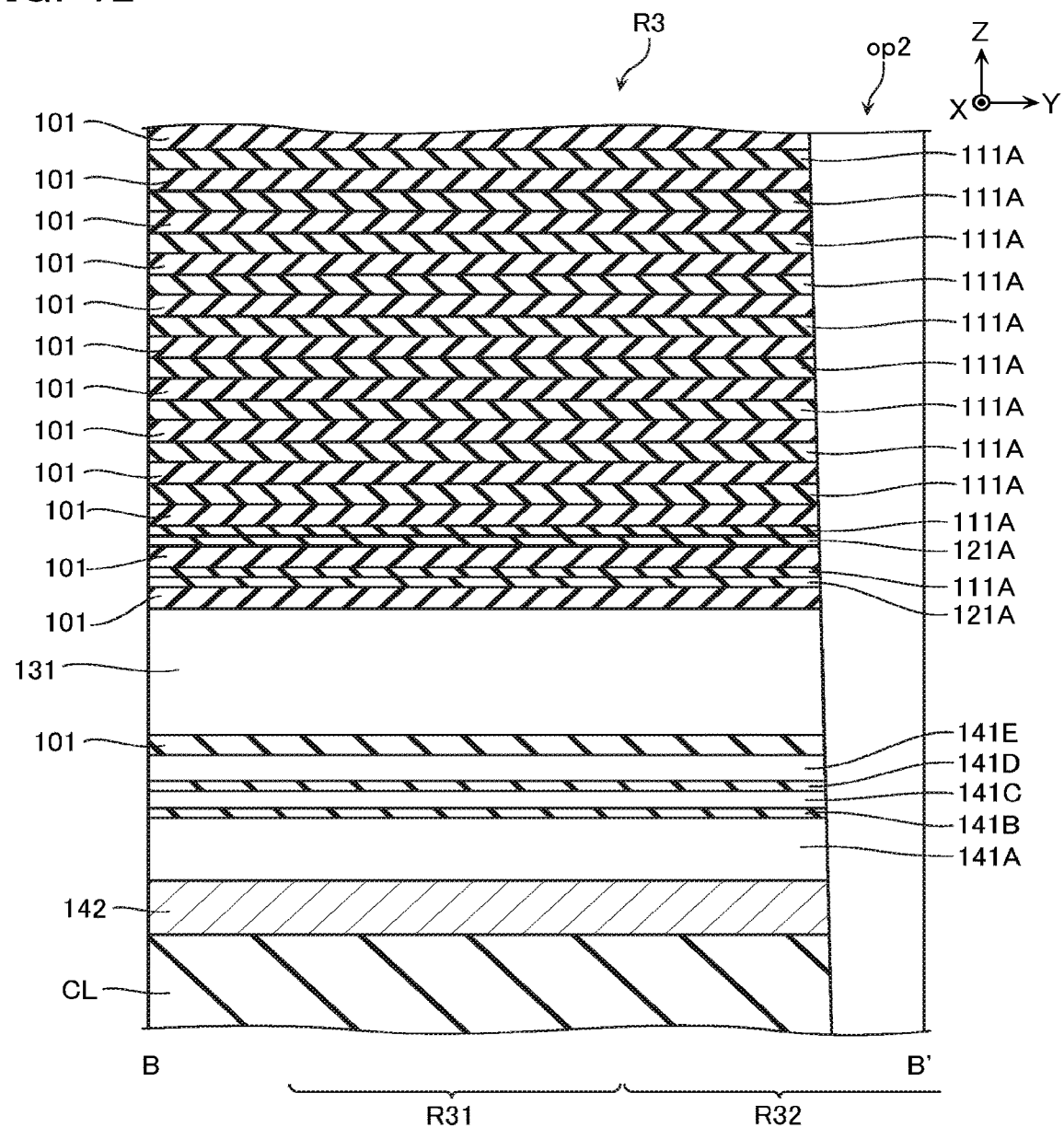
FIG. 12 is a schematic cross-sectional view illustrating the manufacturing method.

Next, as illustrated in FIG. 12, an opening op2 is formed. The opening op2 is an opening that extends in the Z direction, penetrates the insulating films 111A, the insulating films 121A, the conductive film 131, the interlayer insulating films 101, the semiconductor film 141E, the insulating film 141D, the semiconductor film 141C, the insulating film 141B, the semiconductor film 141A, the conductive film 142, and a part of configurations of the circuit layer CL to expose a wiring and the like included in the circuit layer CL. This process is, for example, performed by a method such as RIE.

Figure 13:
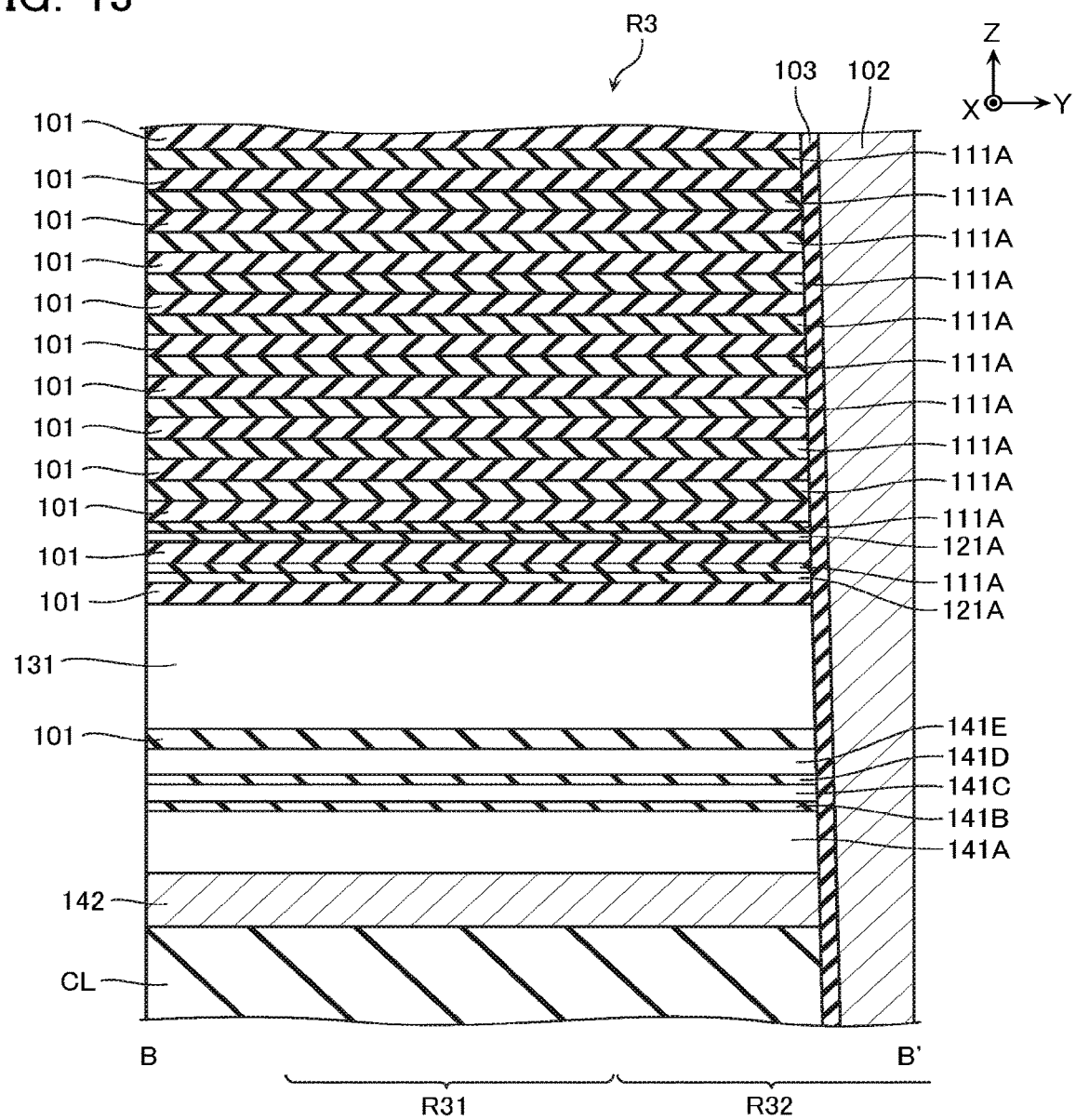
FIG. 13 is a schematic cross-sectional view illustrating the manufacturing method.

Next, as illustrated in FIG. 13, the contact 102 and an insulating film 103 such as silicon oxide are formed in the inner peripheral surface of the opening op2. This process is, for example, performed by forming the insulating film 103 by a method such as CVD, exposing the wiring and the like in a bottom surface of the opening op2 by a method such as RIE, and forming the contact 102 by a method such as CVD.

Figure 14:
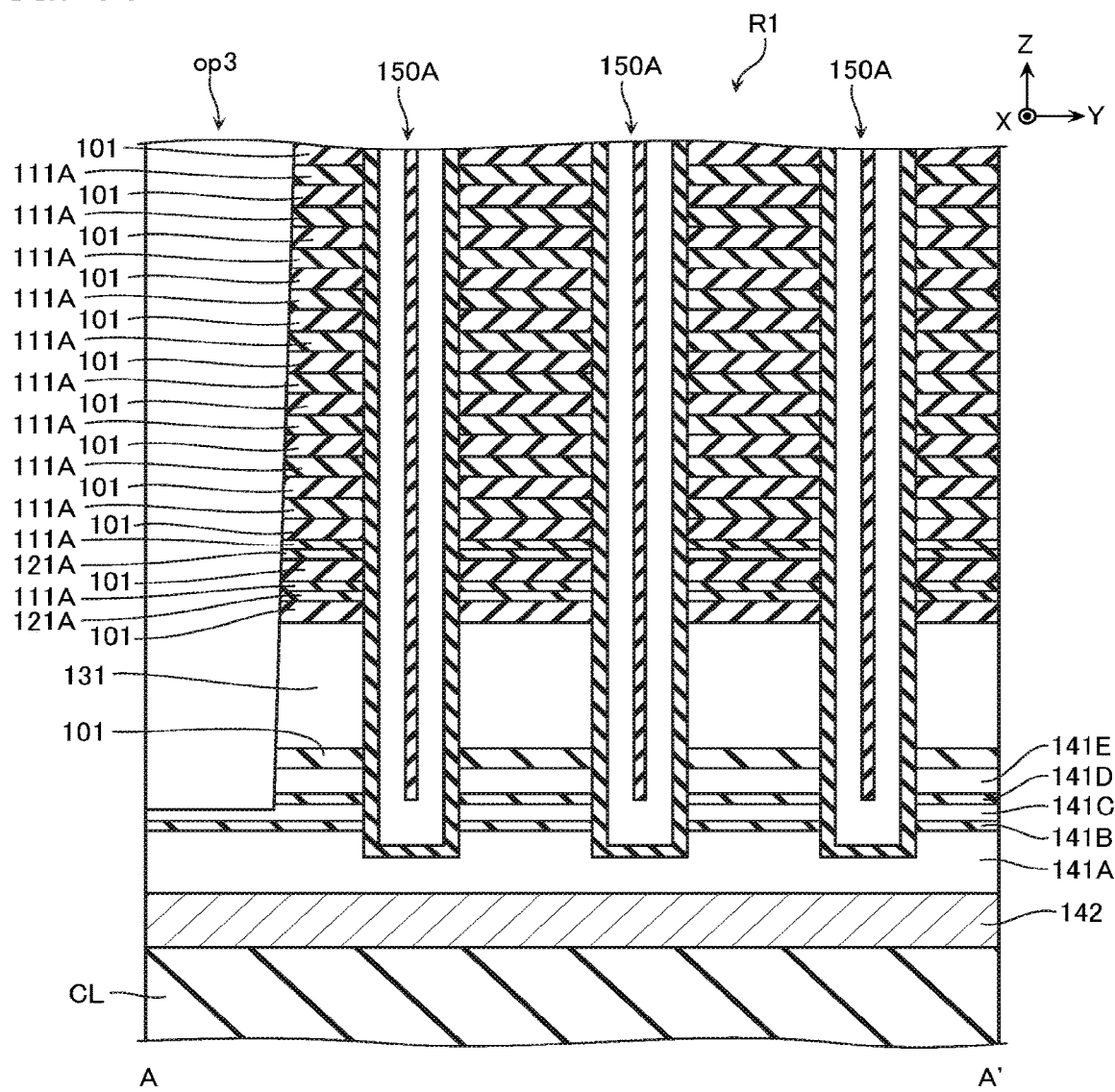
FIG. 14 is a schematic cross-sectional view illustrating the manufacturing method.

Next, as illustrated in FIG. 14, an opening op3 is formed. The opening op3 is disposed at a position corresponding to the insulating portion ST, which has been described with reference to FIG. 4 and the like. The opening op3 is a groove that extends in the Z direction and the X direction, separates the insulating films 111A, the insulating films 121A, the conductive film 131, the interlayer insulating films 101, the semiconductor film 141E, and the insulating film 141D in the Y direction, and exposes the top surface of the semiconductor film 141C. This process is, for example, performed by a method such as RIE.

Figure 15:
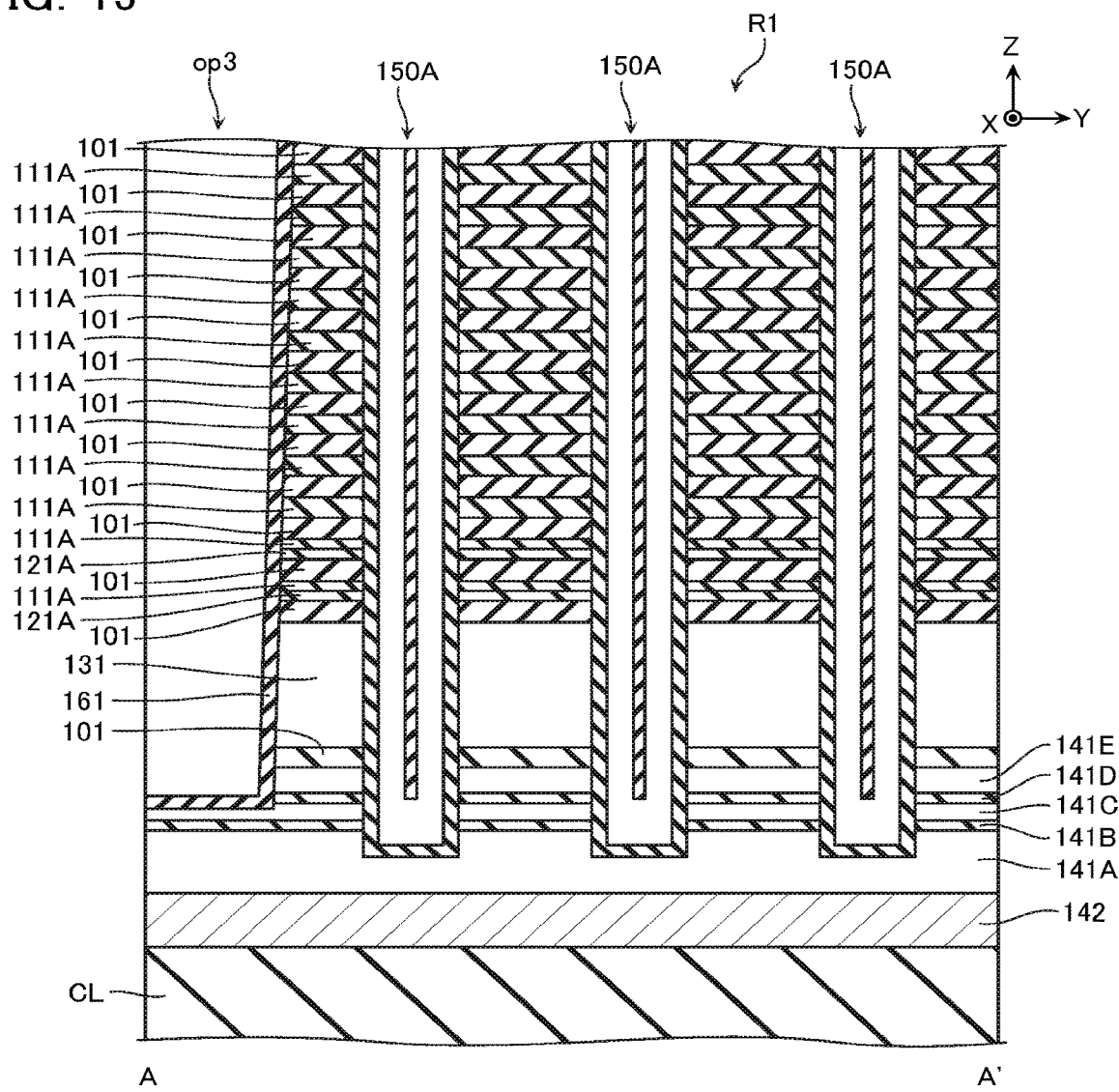
FIG. 15 is a schematic cross-sectional view illustrating the manufacturing method.

Next, as illustrated in FIG. 15, an insulating film 161 such as silicon nitride is formed in the bottom surface and the side surface of the opening op3. This process is, for example, performed by a method such as CVD.

Figure 16:
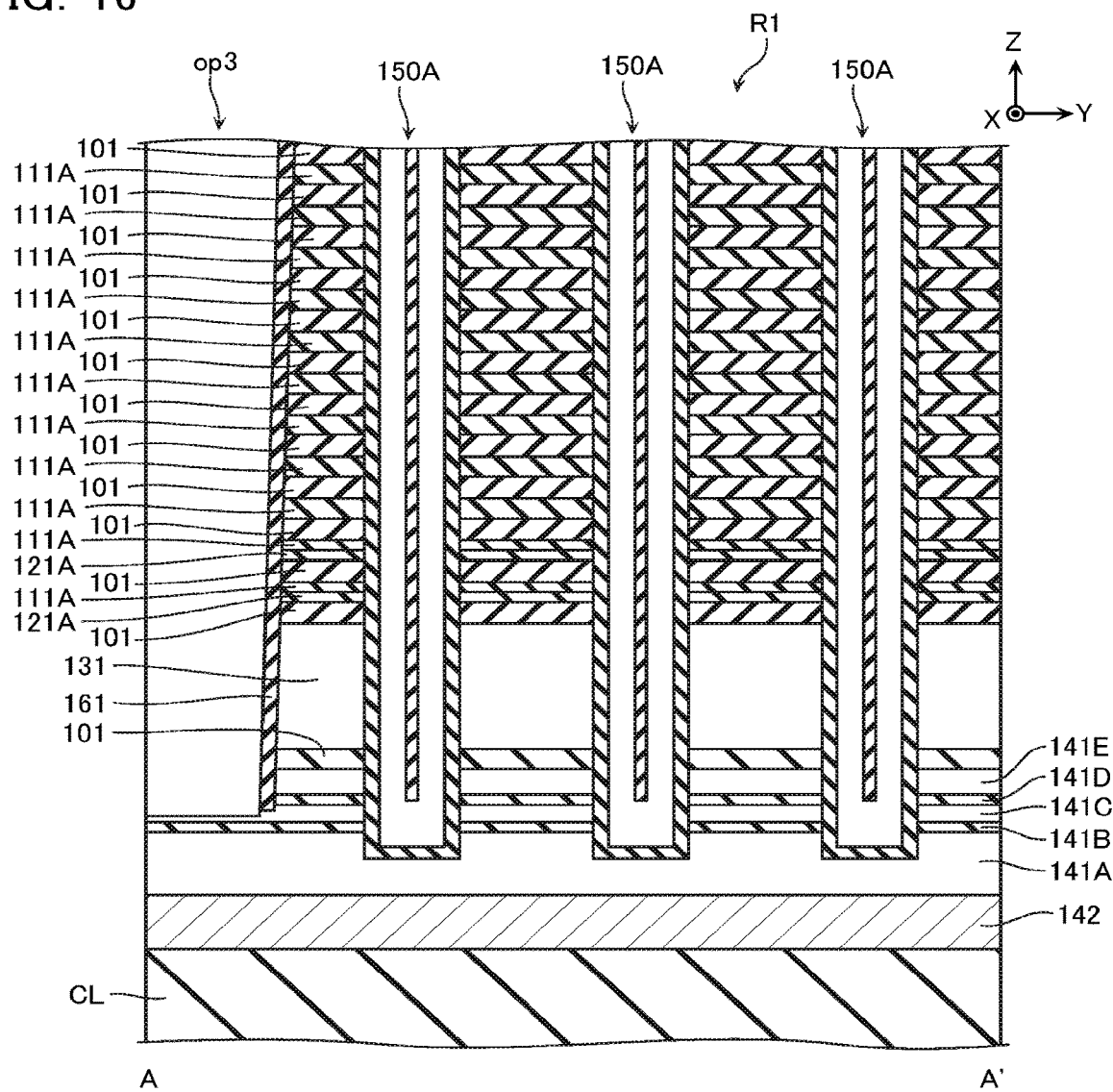
FIG. 16 is a schematic cross-sectional view illustrating the manufacturing method.
Figure 17:
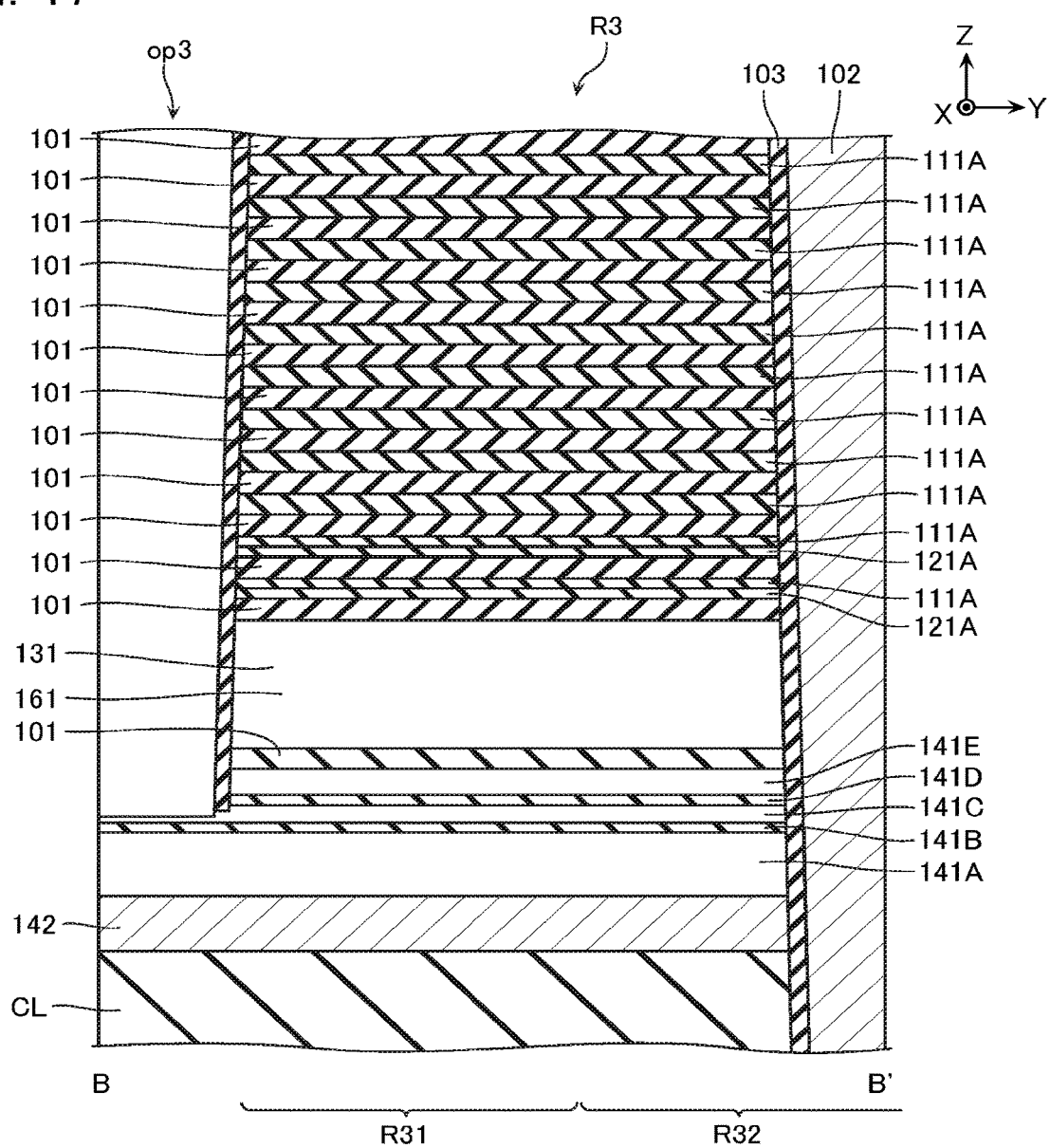
FIG. 17 is a schematic cross-sectional view illustrating the manufacturing method.

Next, as illustrated in FIG. 16 and FIG. 17, a part of the insulating film 161 formed in the bottom surface of the opening op3 is removed to expose the top surface of the semiconductor film 141C. This process is, for example, performed by a method such as RIE.

Figure 18:
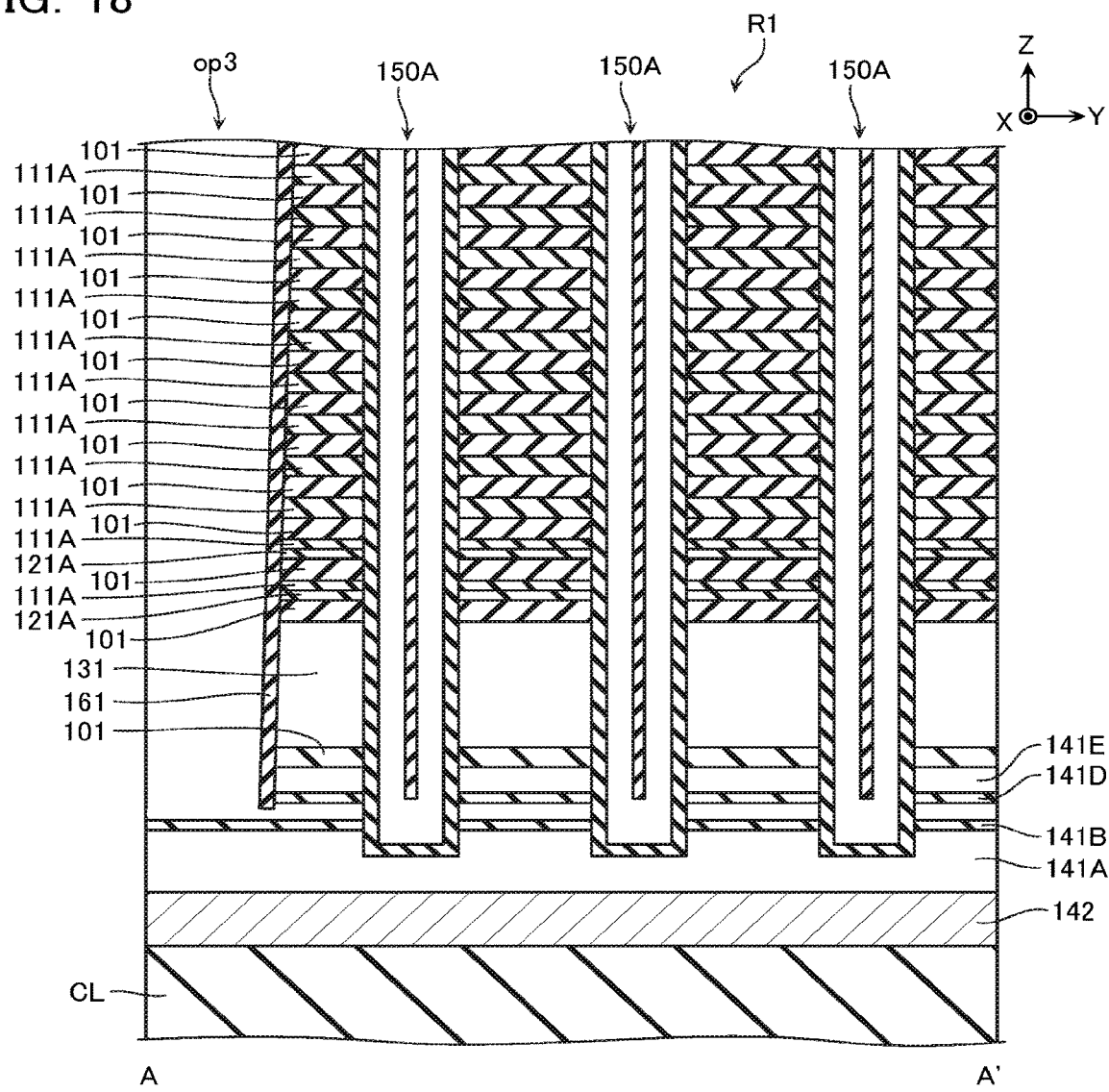
FIG. 18 is a schematic cross-sectional view illustrating the manufacturing method.
Figure 19:
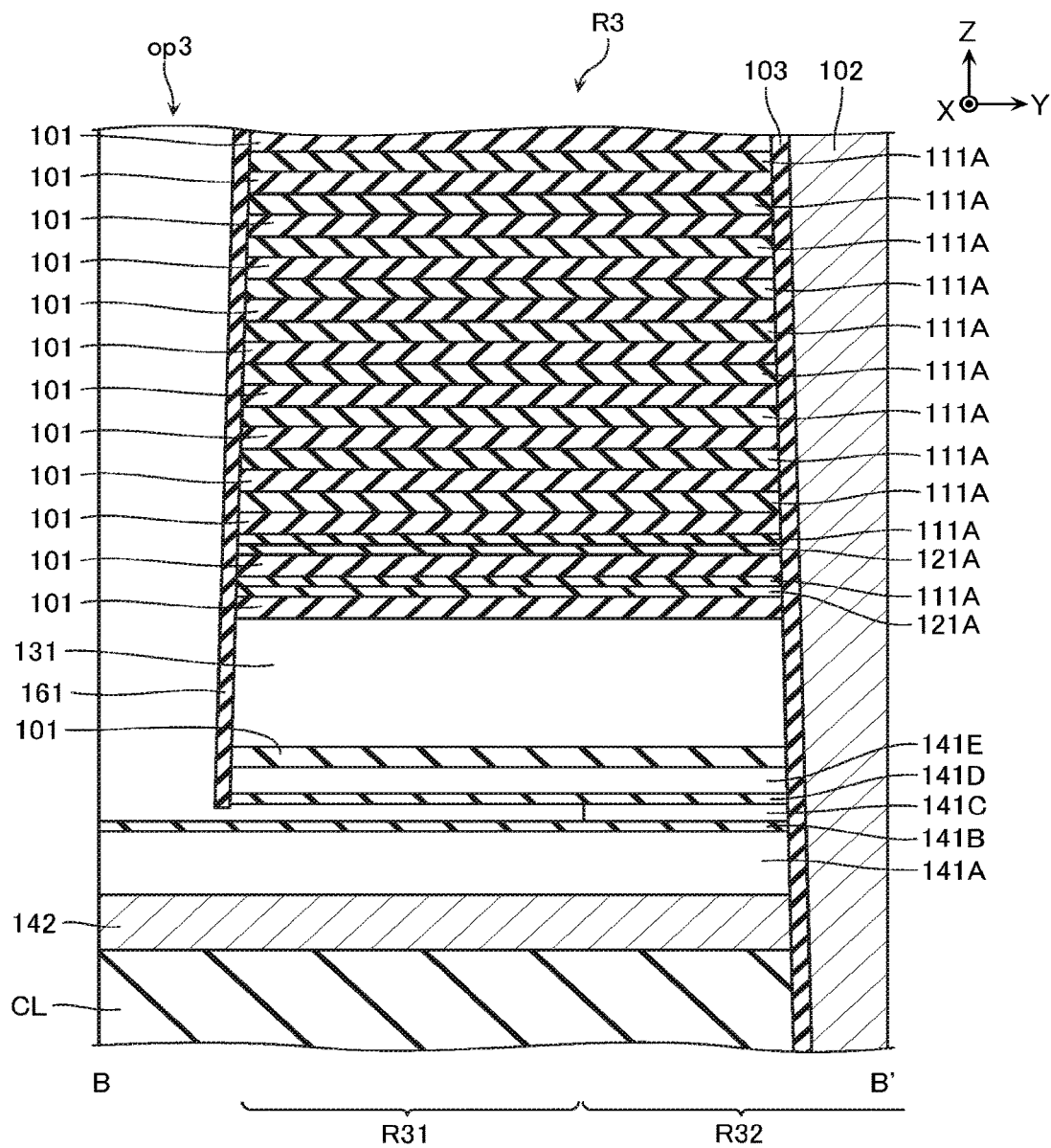
FIG. 19 is a schematic cross-sectional view illustrating the manufacturing method.

Next, as illustrated in FIG. 18 and FIG. 19, the semiconductor film 141C is removed to expose the top surface of the insulating film 141B, the lower surface of the insulating film 141D, and the outer peripheral surface of the structure 150A. This process is, for example, performed by wet etching or a similar method with conditions that the silicon nitride and the silicon oxide are not removed and the silicon is selectively removed.

This process is performed by supplying the opening op3 with chemical solution and removing the silicon nitride with this chemical solution. Here, in the region R1 (FIG. 4), the openings op3 are provided at approximately regular intervals corresponding to the insulating portions ST. Therefore, as illustrated in FIG. 18, all of the semiconductor film 141C is removed in the region R1. On the other hand, the openings op3 are not disposed in the region R3 (FIG. 4). Therefore, as illustrated in FIG. 19, while the semiconductor film 141C is removed in the region R31 where the distance from the opening op3 is equal to or less than the predetermined distance, the semiconductor film 141C is not removed but remains in the region R32 where the distance from the opening op3 is equal to or more than the predetermined distance.

Figure 20:
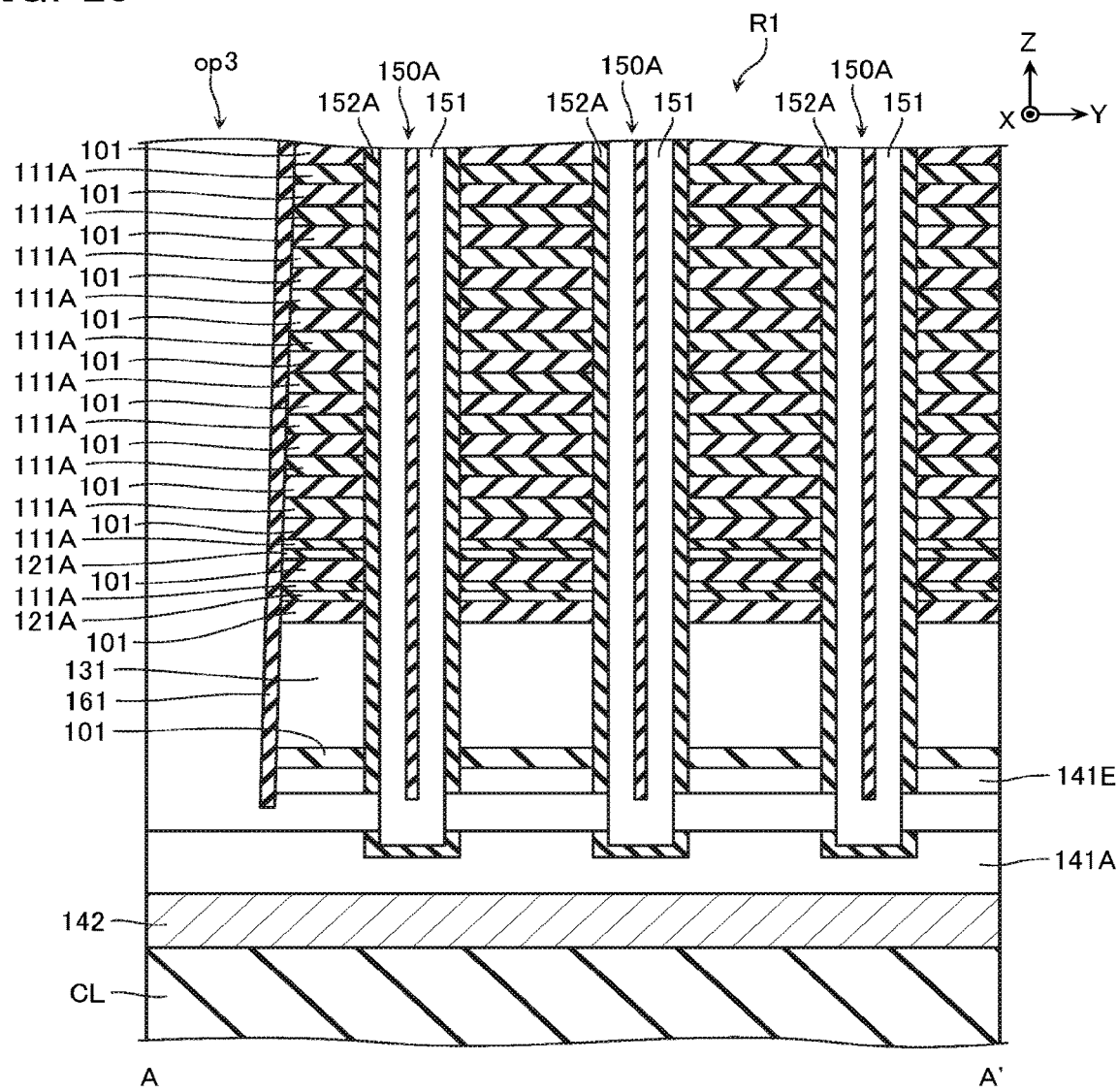
FIG. 20 is a schematic cross-sectional view illustrating the manufacturing method.
Figure 21:
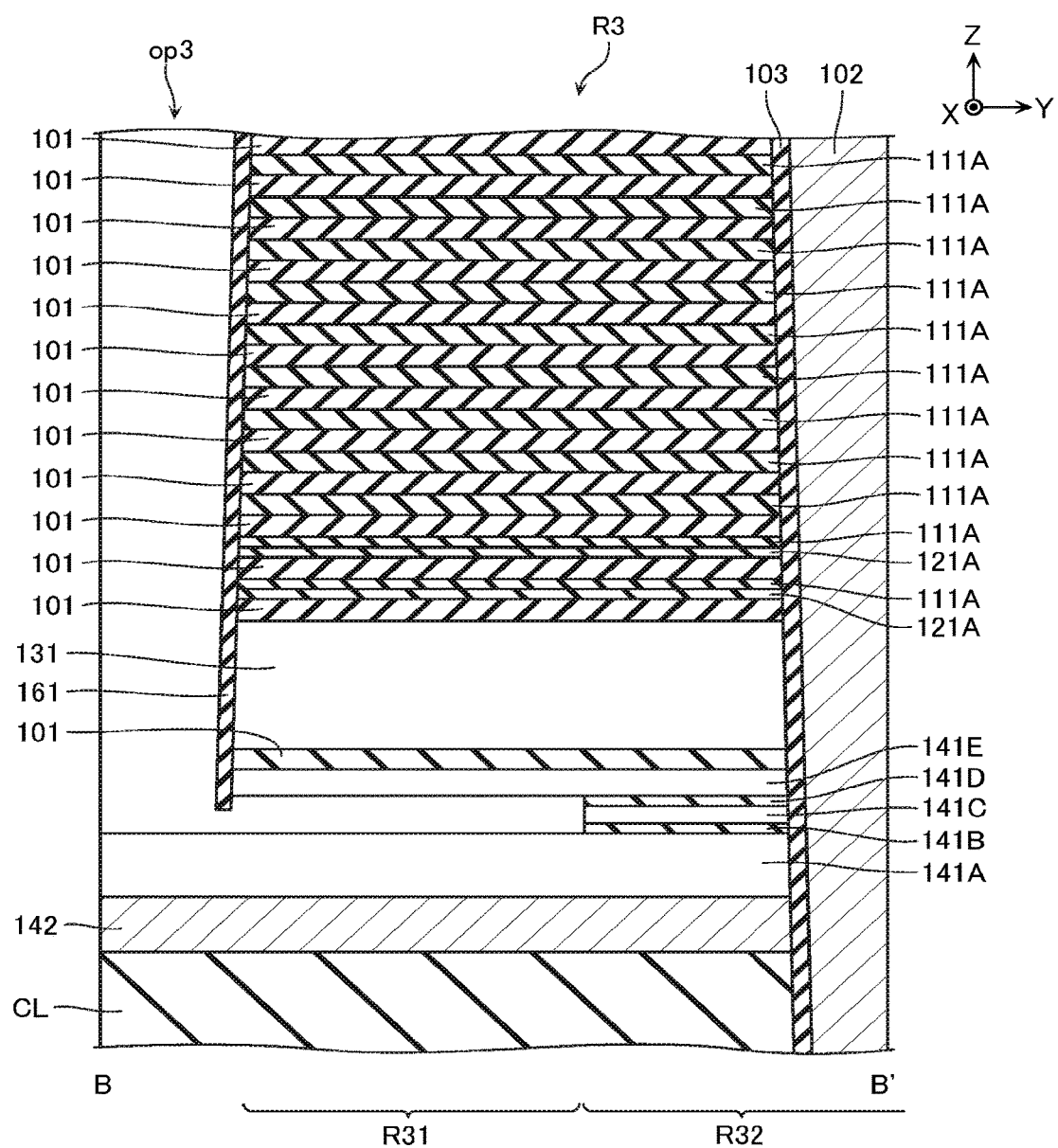
FIG. 21 is a schematic cross-sectional view illustrating the manufacturing method.

Next, as illustrated in FIG. 20 and FIG. 21, the insulating film 141B, the insulating film 141D, and a part of the laminated film 152A are removed to expose the top surface of the semiconductor film 141A, the lower surface of the semiconductor film 141E, and a part of the outer peripheral surface of the semiconductor film 151. This process is, for example, performed by performing wet etching or a similar method with conditions that the silicon nitride and the silicon are not removed and the silicon oxide is selectively removed, removing the insulating film 141B and the insulating film 141D, and then sequentially performing wet etching or a similar method with appropriate conditions.

Figure 22:
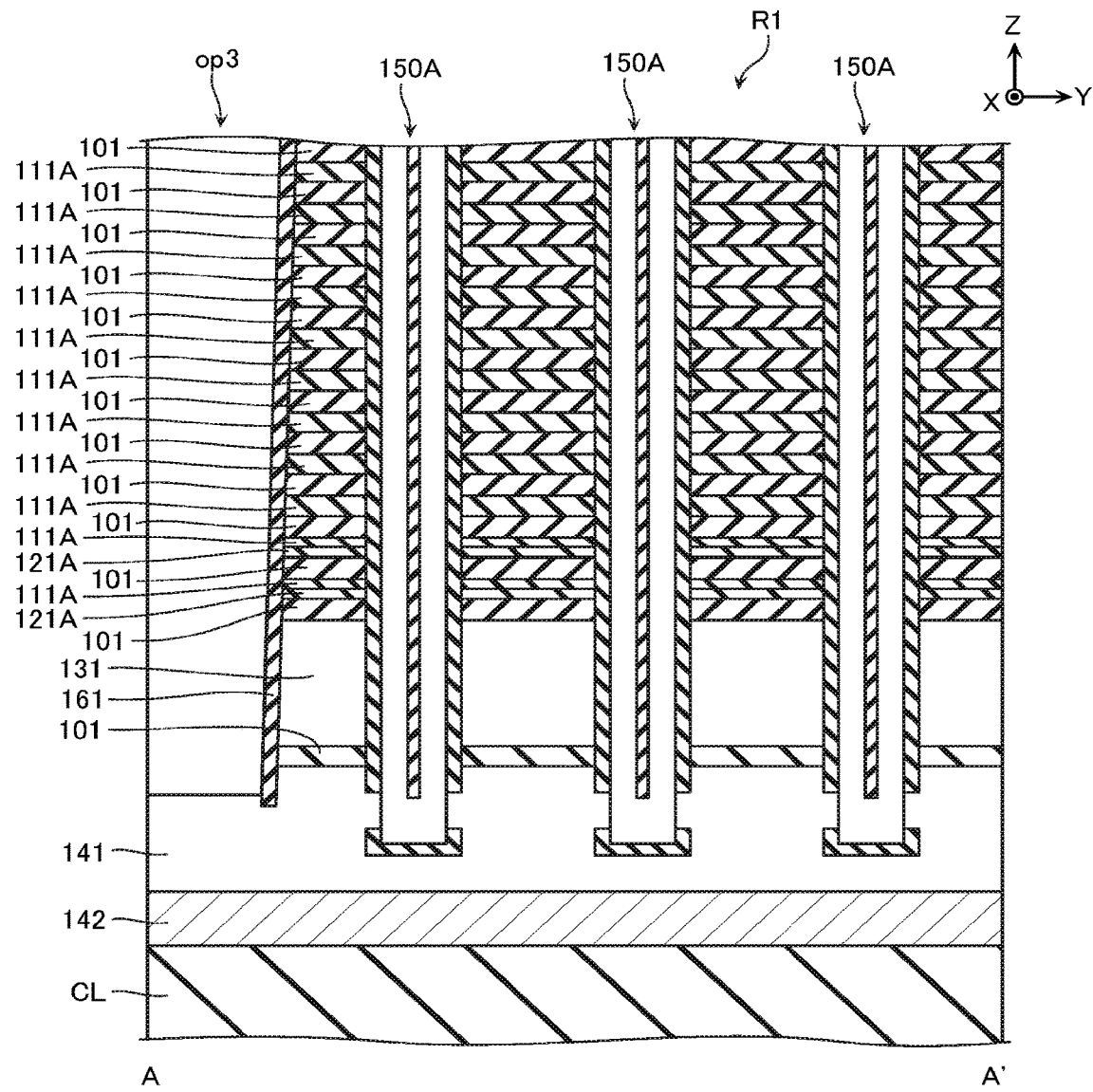
FIG. 22 is a schematic cross-sectional view illustrating the manufacturing method.
Figure 23:
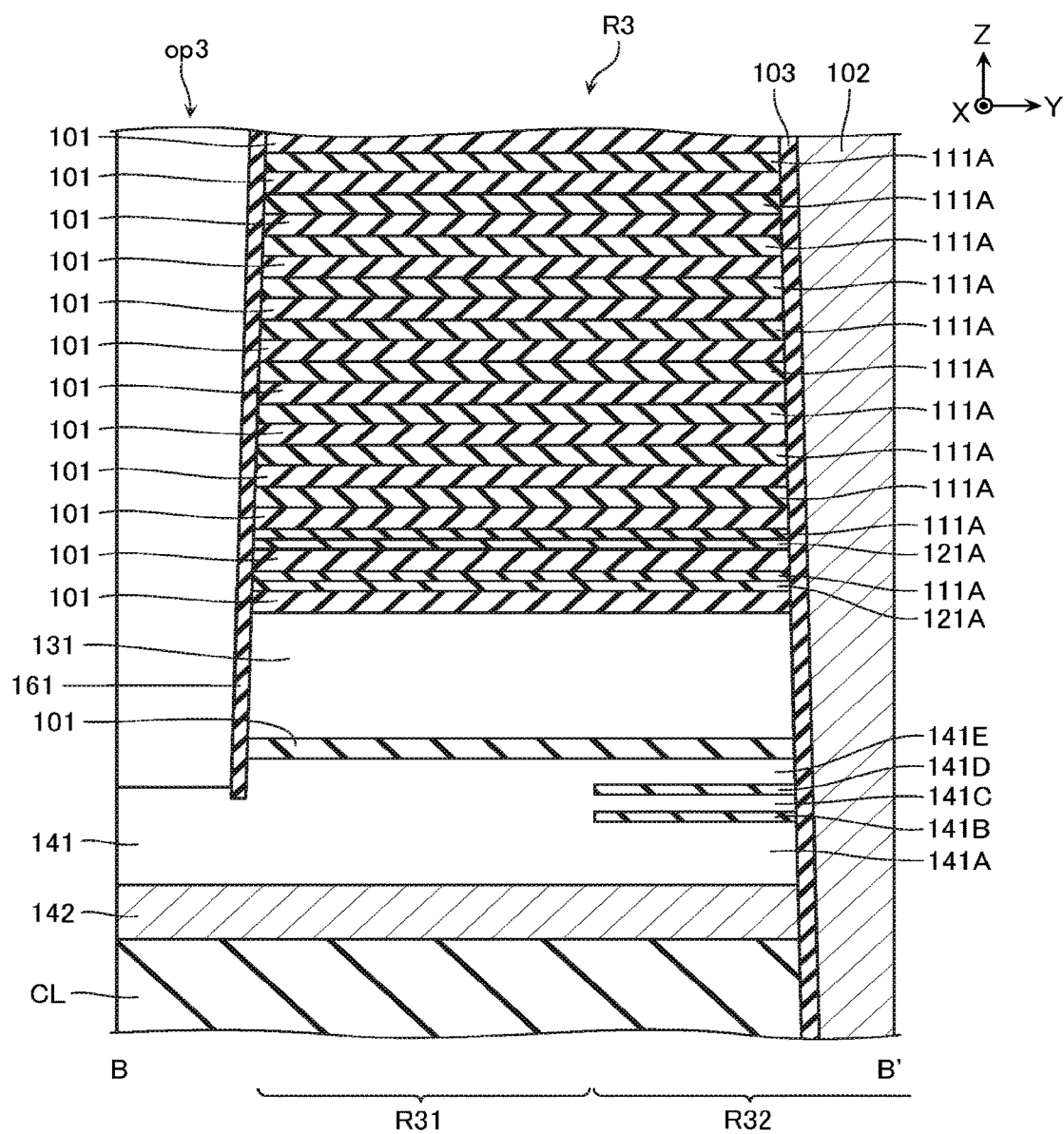
FIG. 23 is a schematic cross-sectional view illustrating the manufacturing method.

Next, as illustrated in FIG. 22 and FIG. 23, a semiconductor film is formed on the top surface of the semiconductor film 141A, the lower surface of the semiconductor film 141E, and a part of the outer peripheral surface of the semiconductor film 151 to form the conductive film 141. This process is, for example, performed by a method such as CVD or an epitaxial crystal growth method.

Figure 24:
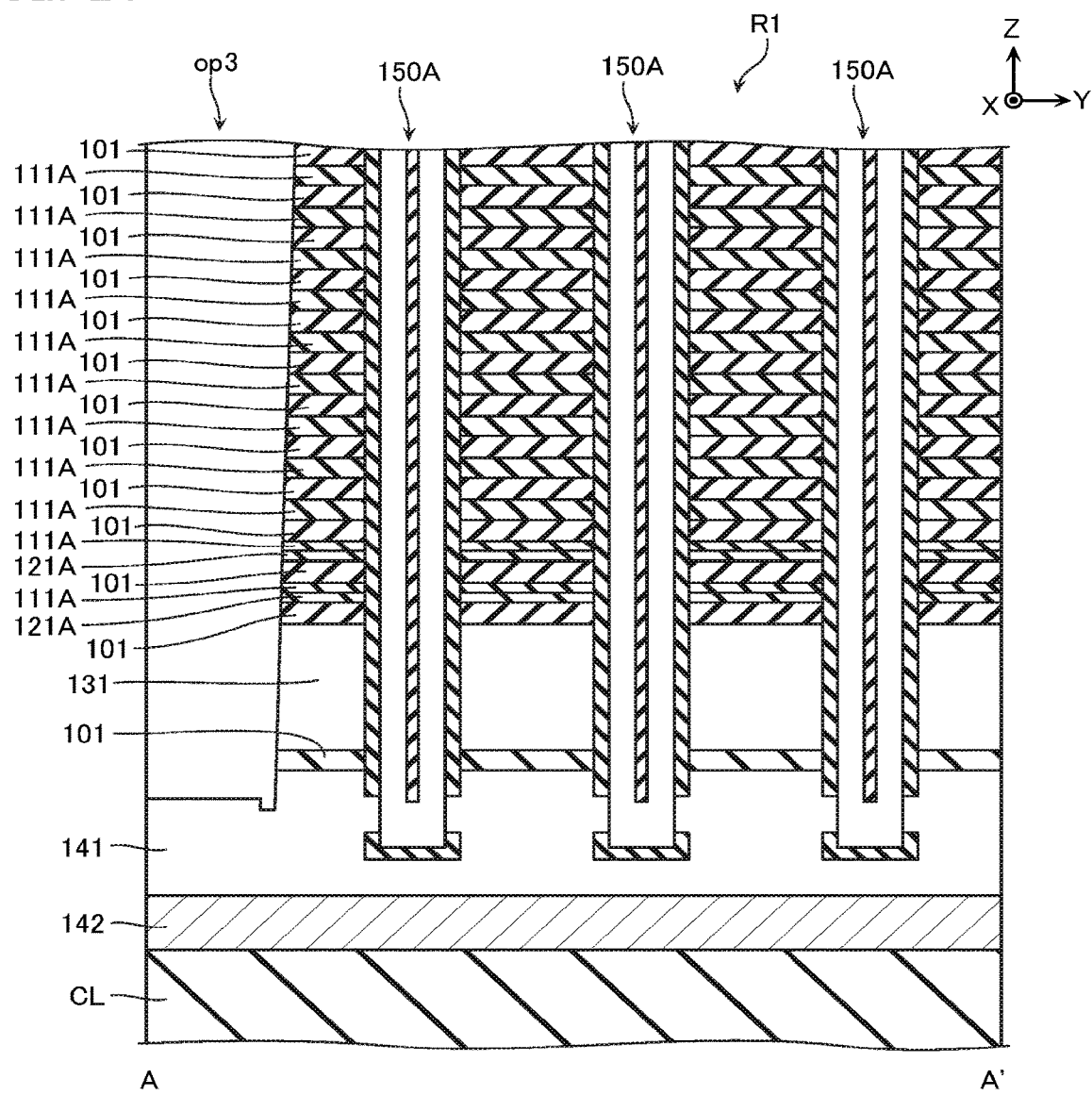
FIG. 24 is a schematic cross-sectional view illustrating the manufacturing method.

Next, as illustrated in FIG. 24, the insulating film 161 is removed to expose side surfaces of the insulating films 111A, the insulating films 121A, the conductive films 131, and the interlayer insulating films 101 in the Y direction. This process is, for example, performed by a method such as wet etching.

Figure 25:
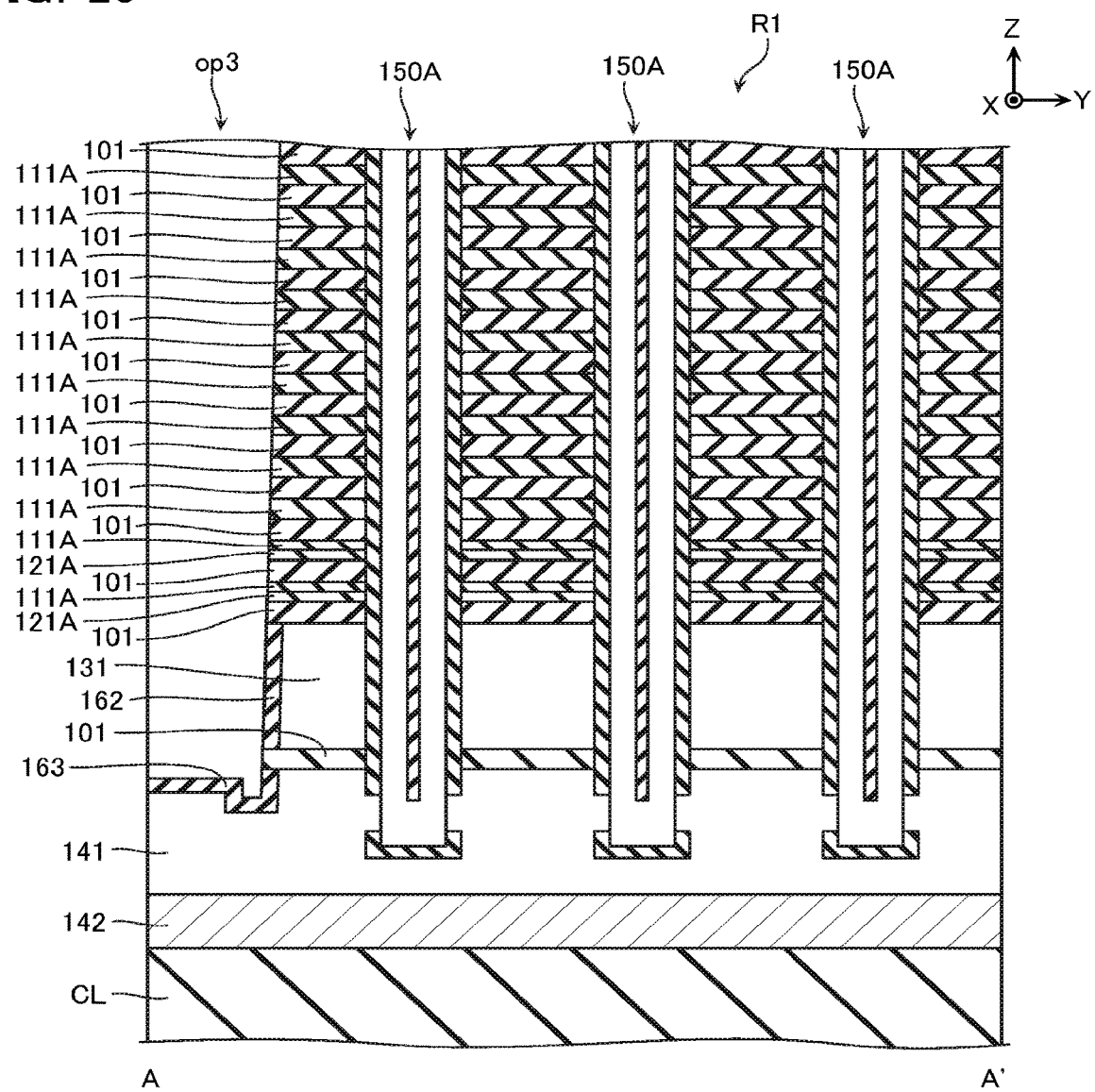
FIG. 25 is a schematic cross-sectional view illustrating the manufacturing method.
Figure 26:
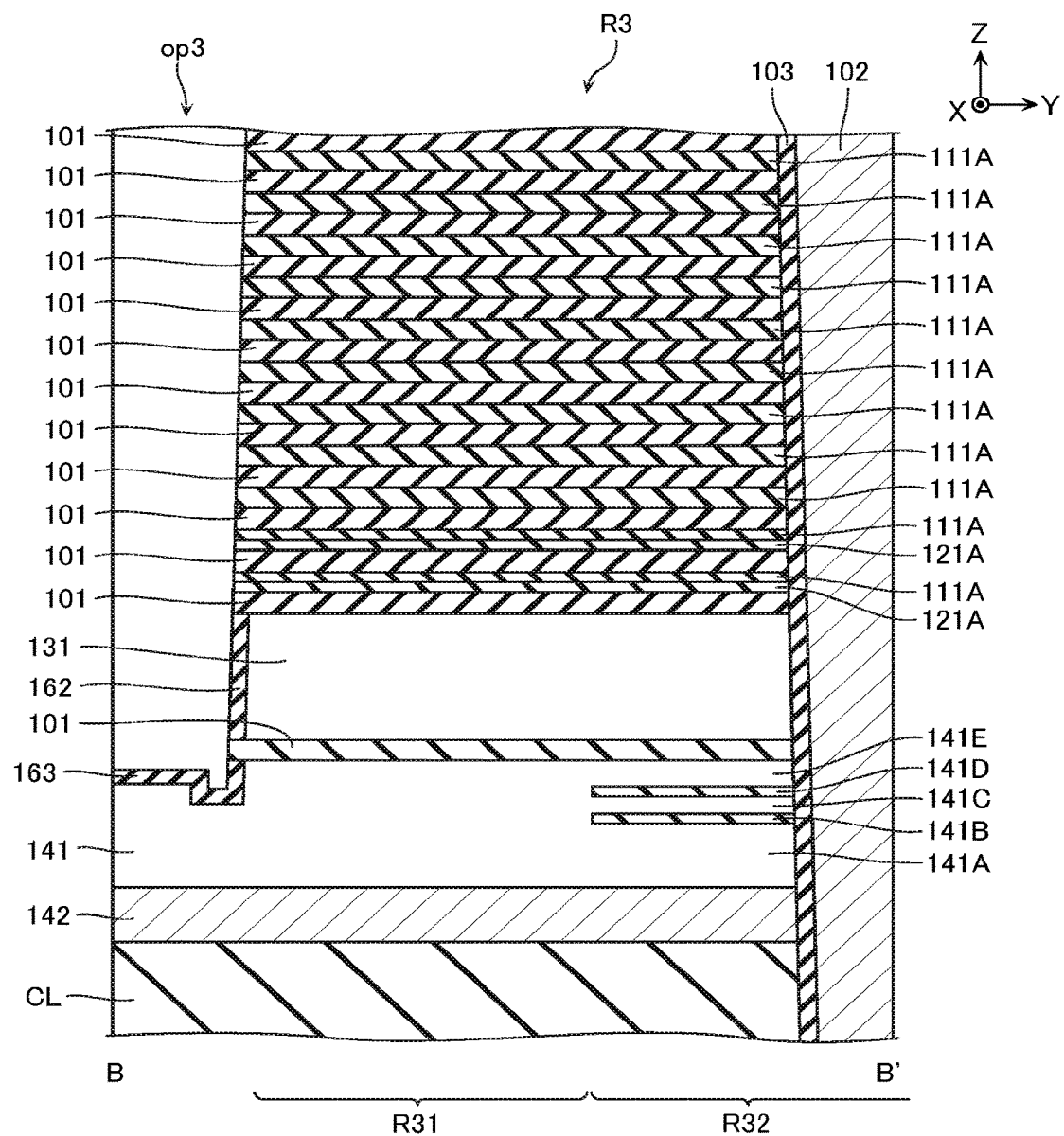
FIG. 26 is a schematic cross-sectional view illustrating the manufacturing method.

Next, as illustrated in FIG. 25 and FIG. 26, a part of the conductive film 131 and the conductive film 141 are oxidized to form oxide films 162 and 163. This process is, for example, performed by oxidized treatment or a similar method with conditions that the silicon nitride is not oxidized and the silicon is selectively oxidized.

Next, as illustrated in FIG. 27 to FIG. 30, the insulating films 111A and the insulating films 121A are removed. This process is, for example, performed by performing wet etching or a similar method with conditions that the silicon oxide is not removed and the silicon nitride is selectively removed.

Figure 27:
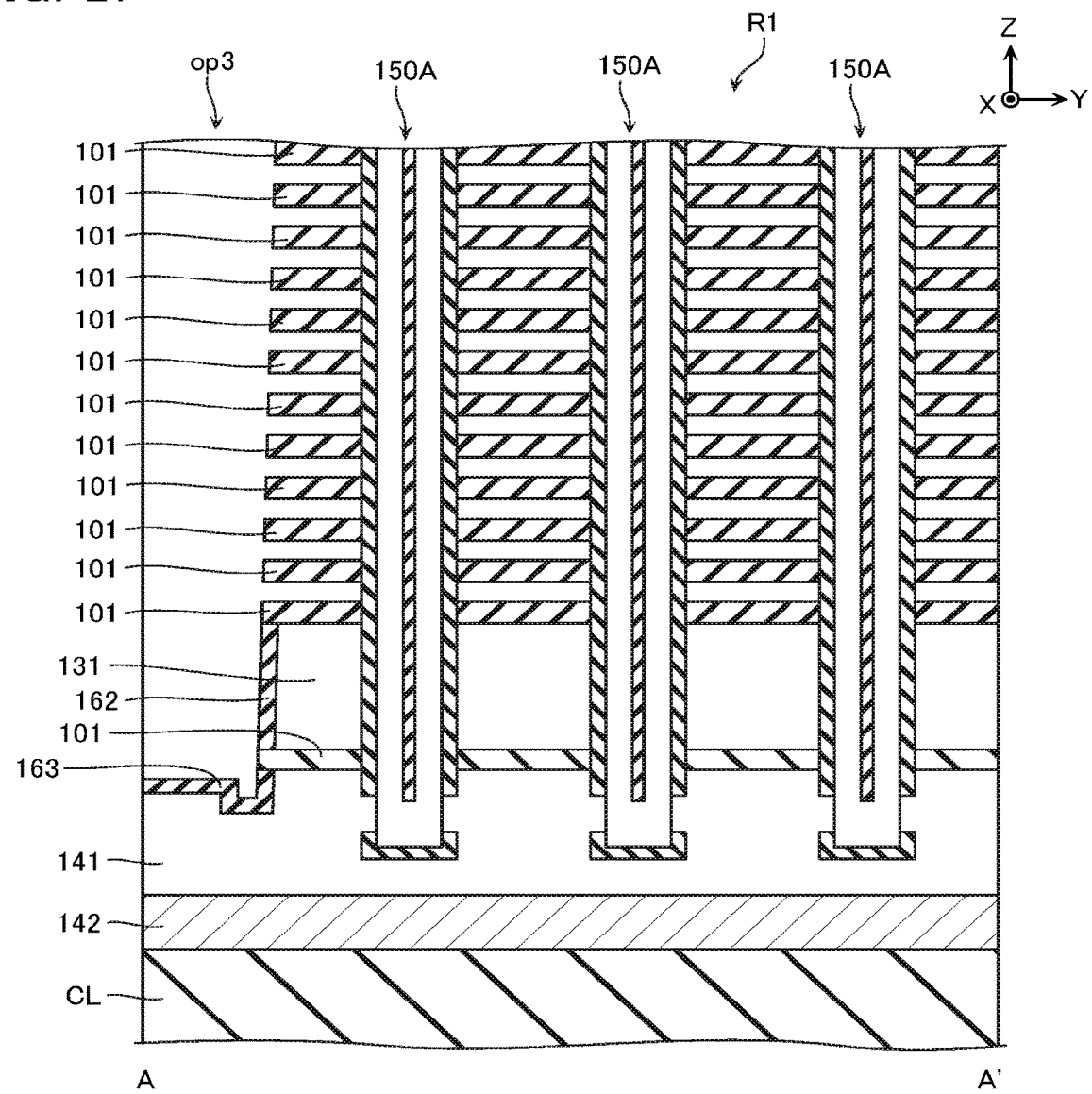
FIG. 27 is a schematic cross-sectional view illustrating the manufacturing method.
Figure 28:
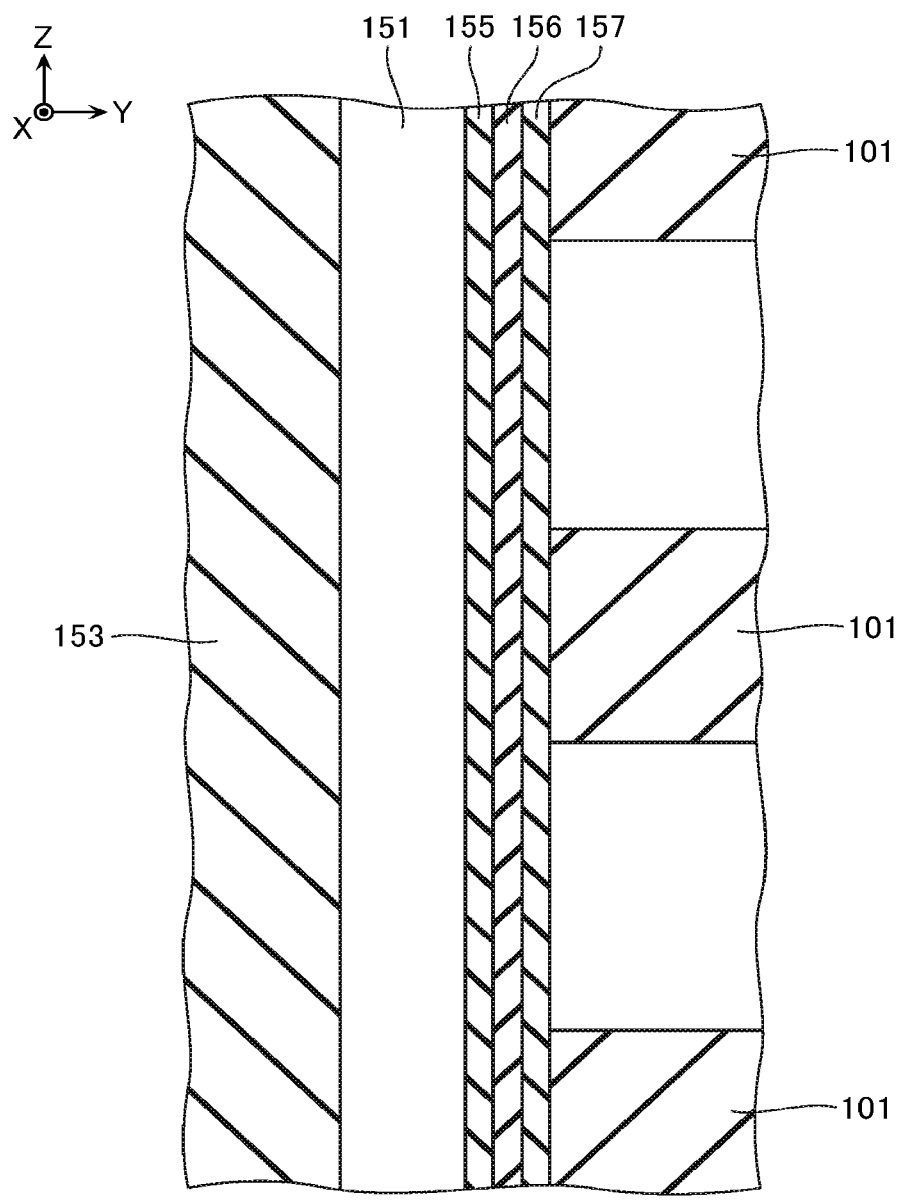
FIG. 28 is a schematic cross-sectional view illustrating the manufacturing method.
Figure 29:
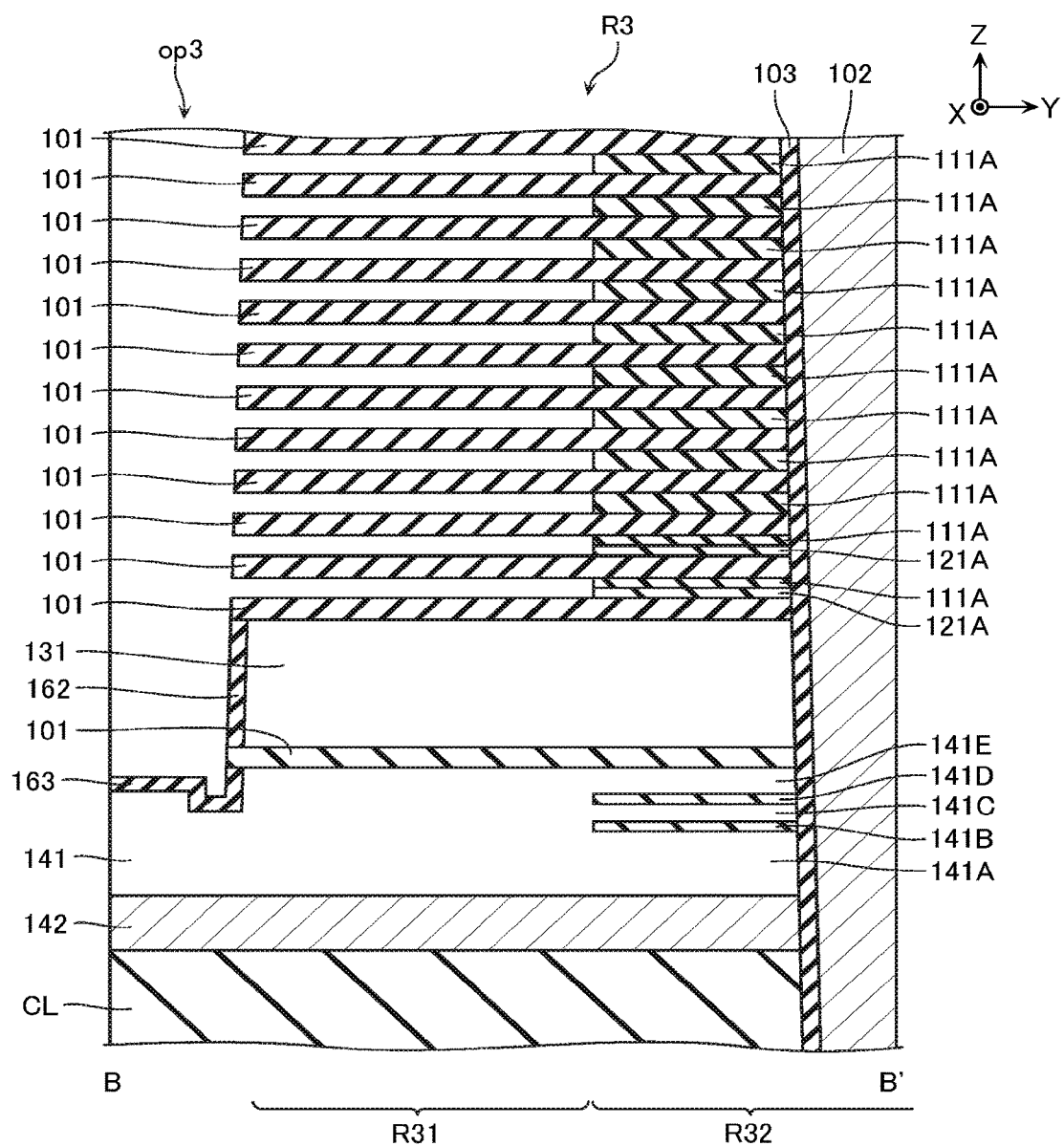
FIG. 29 is a schematic cross-sectional view illustrating the manufacturing method.
Figure 30:
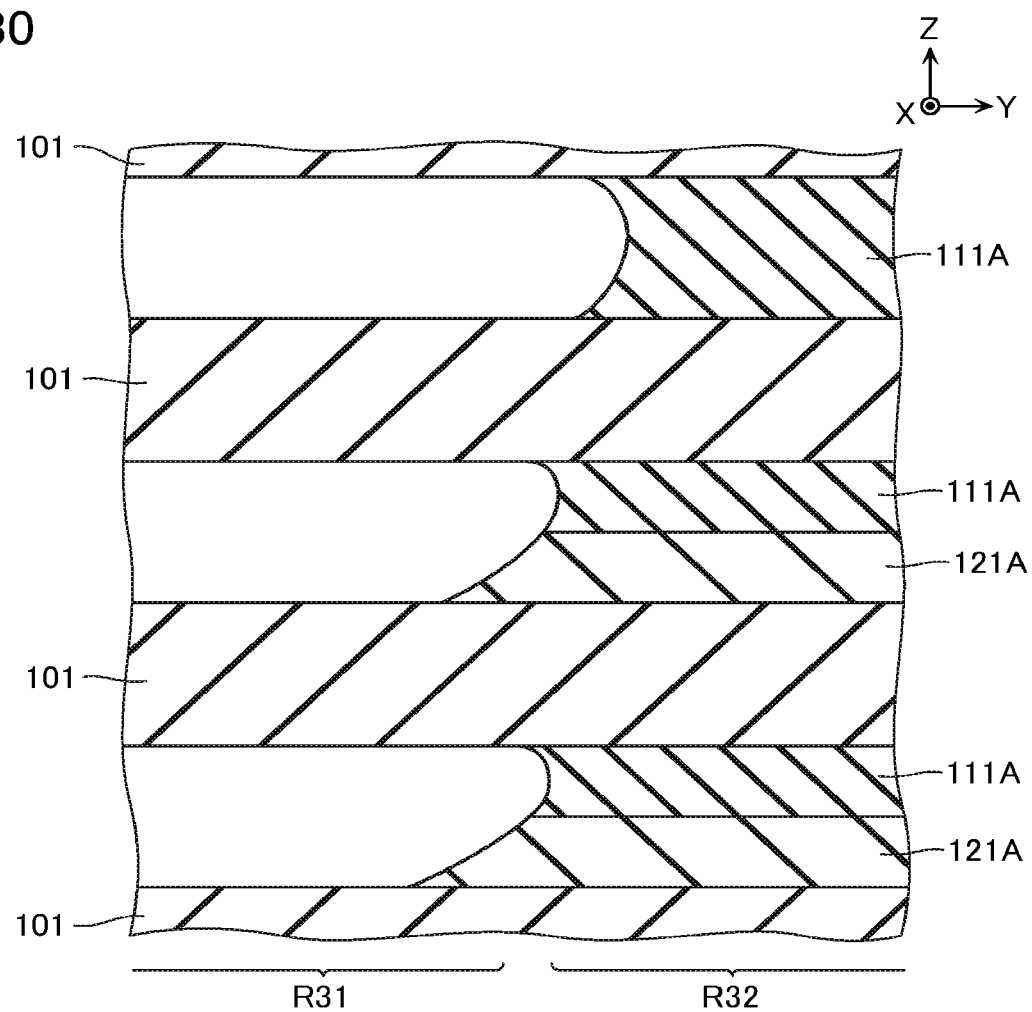
FIG. 30 is a schematic cross-sectional view illustrating the manufacturing method.

This process is performed by supplying the opening op3 with chemical solution and removing the silicon nitride with this chemical solution. Therefore, similarly to the process described with reference to FIG. 18 and FIG. 19, as illustrated in FIG. 27 and FIG. 28, the insulating films 111A and the insulating films 121A are all removed in the region R1. Additionally, the outer peripheral surface of the laminated film 152A is exposed. Meanwhile, as illustrated in FIG. 29 and FIG. 30, while the insulating films 111A and the insulating films 121A are removed in the region R31, the insulating films 111A and 121A are not removed but remain in the region R32.

Figure 31:
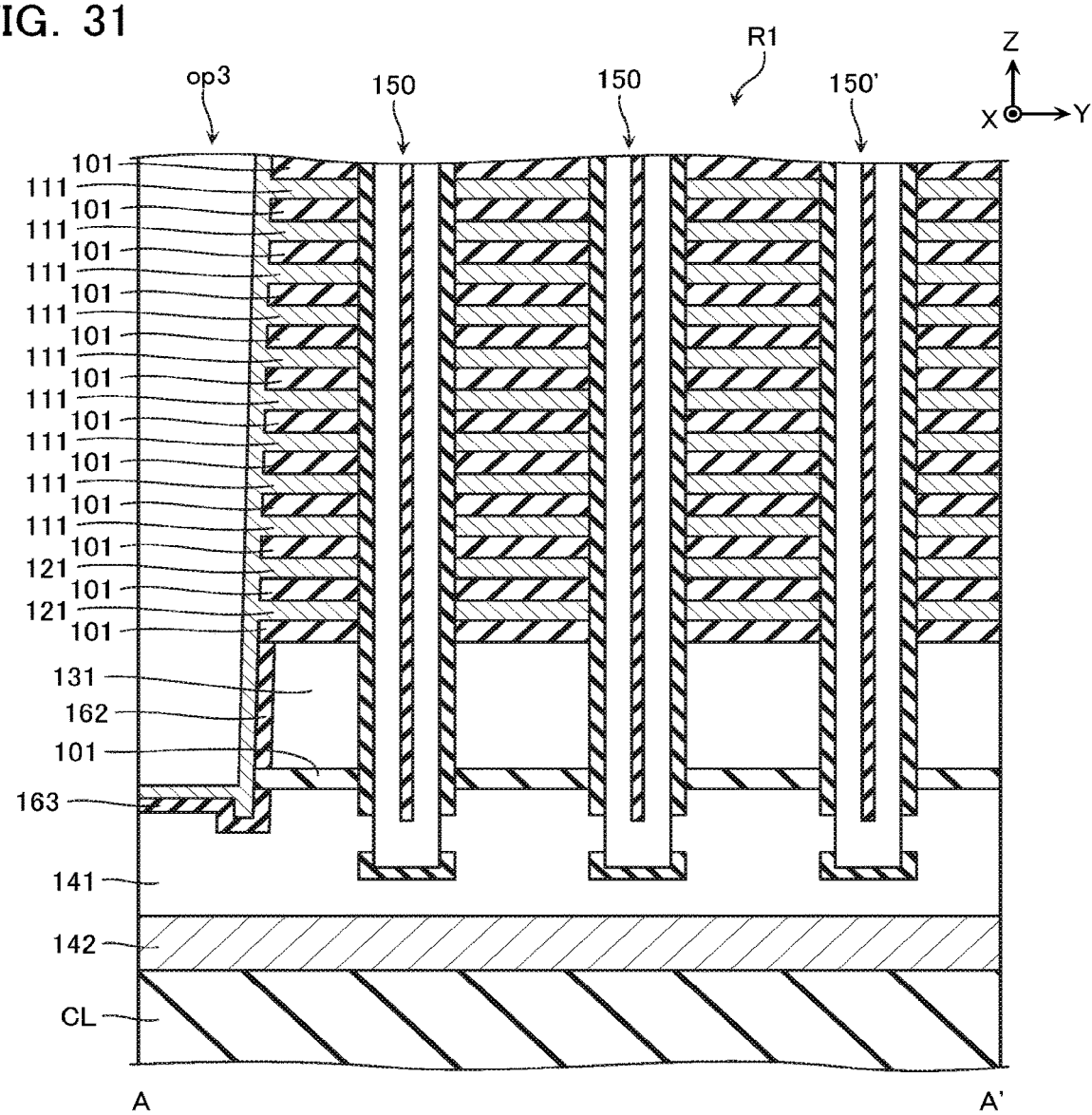
FIG. 31 is a schematic cross-sectional view illustrating the manufacturing method.
Figure 32:
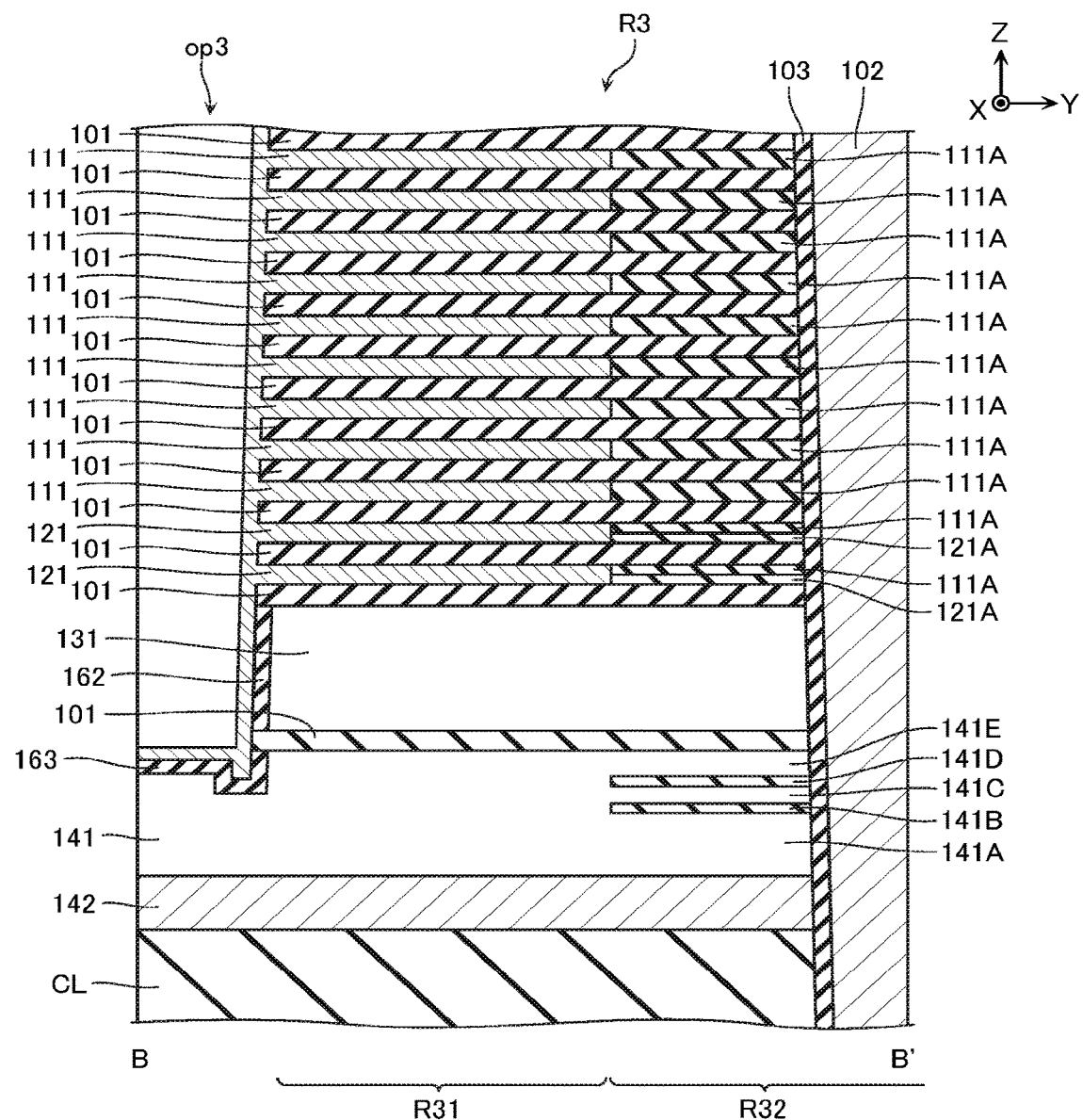
FIG. 32 is a schematic cross-sectional view illustrating the manufacturing method.

Next, as illustrated in FIG. 31 and FIG. 32, the conductive films 111 and the conductive films 121 are formed. This process is, for example, performed by CVD or a similar method.

In this process, as illustrated in FIG. 6, the high-dielectric insulating films 115 and 125, the barrier metal films 114 and 124, and the conductive films 111 and 121 are formed on the top surface and the lower surface of the interlayer insulating film 101 and the outer peripheral surface of the laminated film 152A. As illustrated in FIG. 8, the high-dielectric insulating films 115 and 125, the barrier metal films 114 and 124, and the conductive films 111 and 121 are formed on the side surfaces in the Y direction of the insulating films 111A and the insulating film 121A remained in the region R32.

Afterwards, in the conductive film 111 and the like, by removing the part formed in the side surface of the interlayer insulating film 101 in the Y direction, forming the silicon oxide or the like inside the opening op3, and forming the insulating portion ST, the structure described with reference to FIG. 5 to FIG. 8 is formed. The formation of the bit lines BL and the like forms the structure described with reference to FIG. 2.

[Advantages]

As described with reference to FIG. 9, the embodiment forms the plurality of insulating films 111A and the plurality of interlayer insulating films 101 by a method such as CVD. Such films contain hydrogen in some cases. Additionally, hydrogen diffuses in the heat treatment or a similar treatment described with reference to FIG. 11 in some cases. Here, when the hydrogen reaches an interface between the conductive film 142 and the semiconductor film 141A, the semiconductor film 141A possibly peels off from the conductive film 142.

Therefore, in the embodiment, as described with reference to FIG. 9 and the like, the insulating films 121A are disposed between the plurality of insulating films 111A and the semiconductor film 141A. In the above-described example, the insulating film 121A is the high-density insulating film of silicon nitride formed by a method such as LPCVD using dichlorosilane. Such insulating film allows preferably reducing the diffusion of hydrogen and reducing the peeling of the semiconductor film 141A. This improves a yield of the semiconductor memory device, thereby ensuring saving the manufacturing cost.

In the embodiment, in the process described with reference to FIG. 27 to FIG. 30, the insulating films 121A are removed and the conductive films 121 are formed in these removed parts. That is, in the embodiment, the use of a part of sacrificial films reduces the diffusion of hydrogen. Focusing on this respect, the insulating films 121A are preferably removable in a short period. However, the high-density silicon nitride, compared with low-density silicon nitride, tends to have the smaller etching rate.

Therefore, in the embodiment, as described with reference to FIG. 9 and the like, the low-density insulating films 111A of silicon nitride or the like formed by a method such as plasma CVD are formed on the top surfaces of the insulating films 121A. This shortens a period required to remove the insulating films 121A, thereby ensuring saving the manufacturing cost.

In the embodiment, both of the insulating film 111A and the insulating film 121A are silicon nitride and removable with identical chemical solution. Therefore, for example, compared with a case where different chemical solutions are required to remove the insulating films 111A and remove the insulating films 121A, the number of manufacturing processes can be reduced and the manufacturing cost can be saved.

In the embodiment, the use of a part of the sacrificial films reduces the diffusion of hydrogen. Thus, the diffusion of hydrogen can be reduced without hardly affecting the configuration, the size, and similar specifications of the manufactured semiconductor memory devices.

As described above, there may be a case where the insulating films 121A, the insulating films 111A, or similar films remain in the semiconductor memory device manufactured by such method. For example, in the example of the embodiment, the insulating films 121A and the insulating films 111A remain in the region R3, which has been described with reference to FIG. 3, FIG. 4, FIG. 7, FIG. 8, and the like.

[Other Examples]

As described with reference to FIG. 7, in the above-described example, the insulating films 121A and the insulating films 111A are disposed in the region R32 of the wiring layers 120. However, the insulating film 111A can be omitted in the region R32 of the wiring layer 120, and insertion of another film is also possible.

In the above-described example, the two layers of the wiring layers 120 are disposed between the plurality of wiring layers 110 and the wiring layer 130. However, the wiring layer 120 may be one layer or may be three layers or more.

Second Embodiment

[Configuration]

Figure 33:
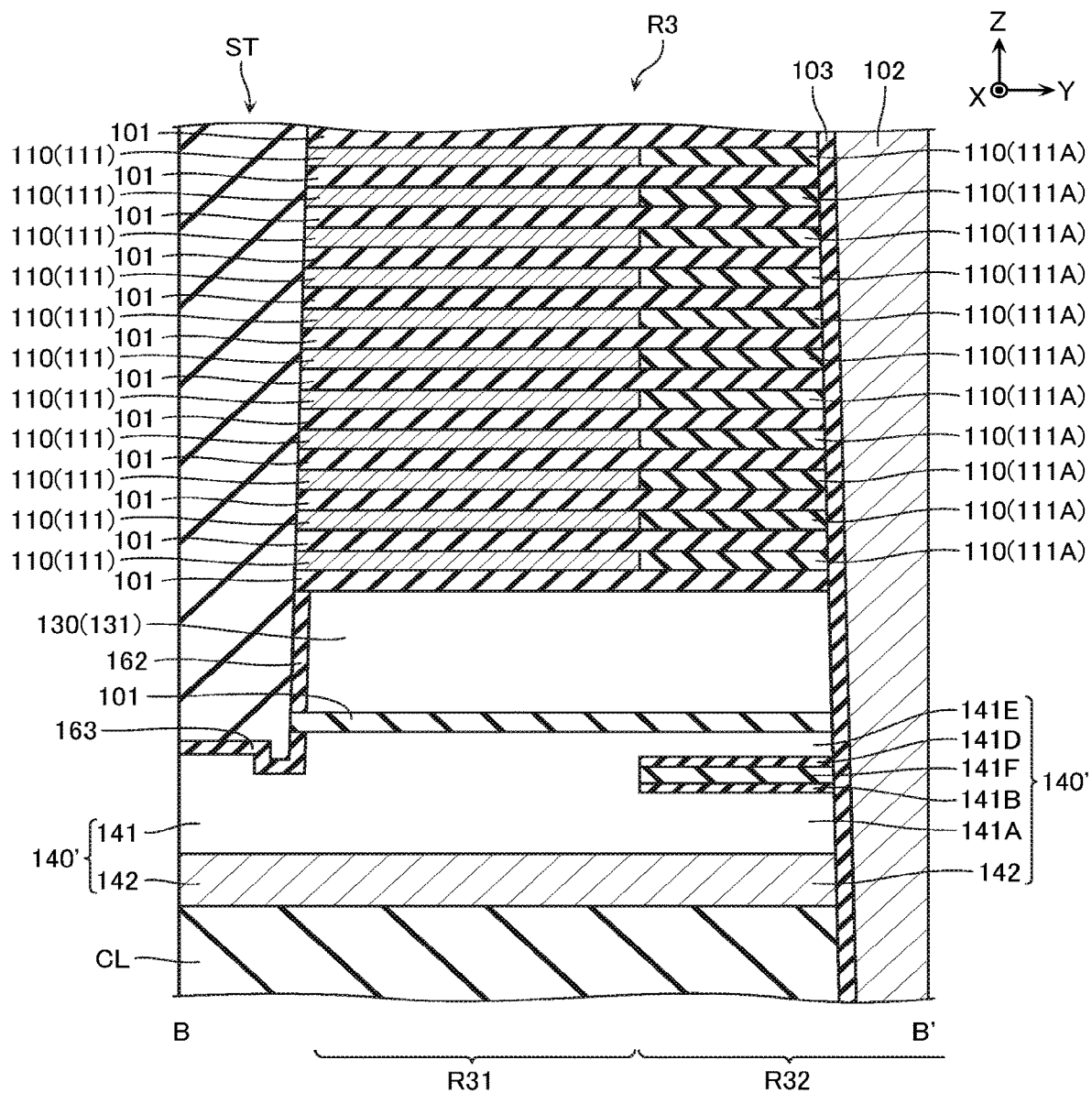
FIG. 33 is a schematic cross-sectional view of a semiconductor memory device according to a second embodiment.

Next, with reference to FIG. 33, a semiconductor memory device according to the second embodiment is described. FIG. 33 is a schematic cross-sectional view of the semiconductor memory device according to the embodiment. For sake of convenience of explanation, FIG. 33 omits a part of configuration. In the following description, identical reference numerals are given to parts similar to those of the first embodiment to omit the description.

The semiconductor memory device according to the embodiment is basically configured similarly to that of the first embodiment, but is different in the structure in the region R3.

In the embodiment, the wiring layer 120 has a configuration similar to that of the wiring layer 110. In other words, the semiconductor memory device according to the embodiment does not include the wiring layer 120.

Additionally, a wiring layer 140' according to the embodiment is basically configured similarly to the wiring layer 140 according to the first embodiment, but includes an insulating film 141F instead of the semiconductor film 141C. The insulating film 141F is configured similarly to the insulating film 121A according to the first embodiment.

[Manufacturing Method]

Figure 34:
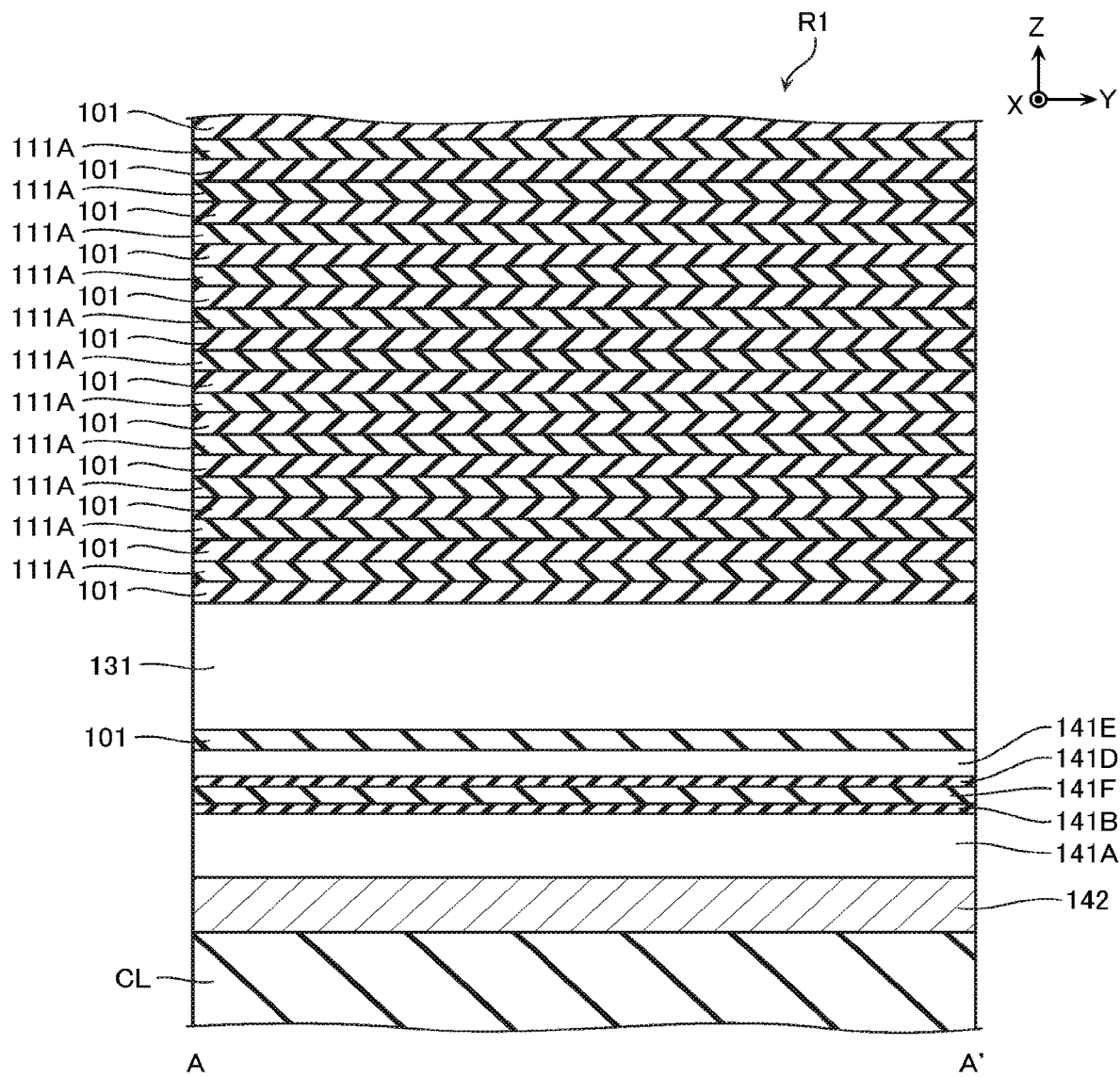
FIG. 34 is a schematic cross-sectional view illustrating a method for manufacturing the semiconductor memory device.

The semiconductor memory device according to the embodiment is manufacturable approximately similarly to the semiconductor memory device according to the first embodiment. However, as illustrated in FIG. 34, in the embodiment, the insulating film 141F is formed on the insulating film 141B, not the semiconductor film 141C. Additionally, the insulating film 121A is not formed. In the process described with reference to FIG. 15, the insulating film 161 is designed to be a film of amorphous silicon or silicon oxide, not silicon nitride.

[Other Examples]

As described with reference to FIG. 33, in the above-described example, the insulating film 141F is disposed between the insulating film 141B and the insulating film 141D in the region R32 of the wiring layer 140'. However, in addition to the insulating film 141F, the insulating film 111A can be disposed between the insulating film 141B and the insulating film 141D, and insertion of another film is also possible.

Third Embodiment

[Configuration]

Figure 35:
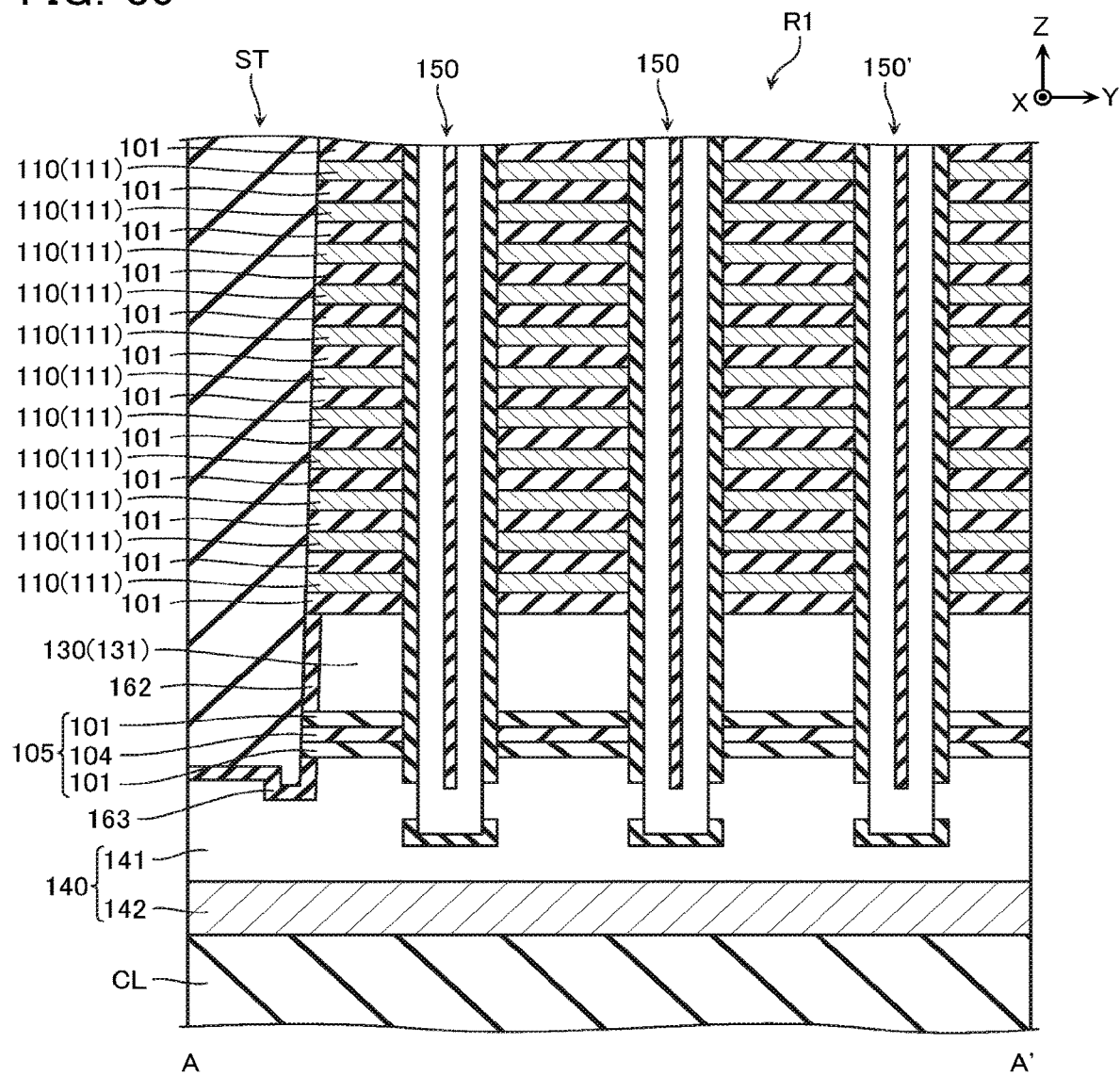
FIG. 35 is a schematic cross-sectional view of a semiconductor memory device according to a third embodiment.

Next, with reference to FIG. 35, a semiconductor memory device according to the third embodiment is described. FIG. 35 is a schematic cross-sectional view of the semiconductor memory device according to the embodiment. For sake of convenience of explanation, FIG. 35 omits a part of configuration. In the following description, identical reference numerals are given to parts similar to those of the first embodiment to omit the description.

The semiconductor memory device according to the embodiment is basically configured similarly to that of the first embodiment, but the wiring layer 120 has a configuration similar to the wiring layer 110 in the embodiment. In other words, the semiconductor memory device according to the embodiment does not include the wiring layer 120 similarly to the second embodiment.

In the embodiment, a laminated film 105 having an insulating property including the interlayer insulating film 101, an insulating film 104, and the interlayer insulating film 101 is disposed between the wiring layer 130 and the wiring layer 140. The insulating film 104 is configured similarly to the insulating film 121A according to the first embodiment.

[Manufacturing Method]

Figure 36:
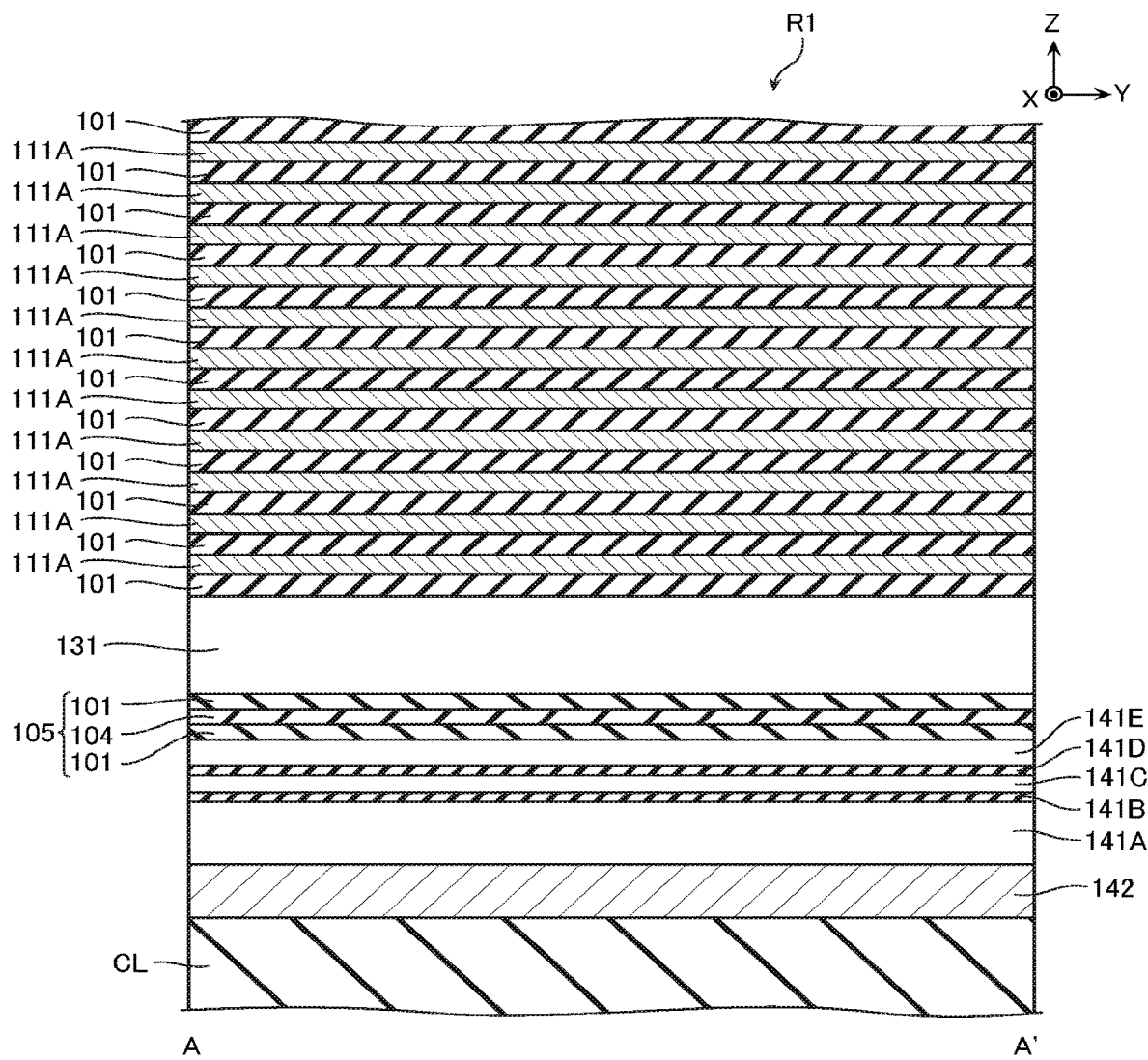
FIG. 36 is a schematic cross-sectional view illustrating a method for manufacturing the semiconductor memory device.

The semiconductor memory device according to the embodiment is manufacturable approximately similarly to the semiconductor memory device according to the first embodiment. However, as illustrated in FIG. 36, in the embodiment, the interlayer insulating film 101, the insulating film 104, and the interlayer insulating film 101 are formed on the semiconductor film 141E. Additionally, the insulating film 121A is not formed.

Fourth Embodiment

[Configuration]

Figure 37:
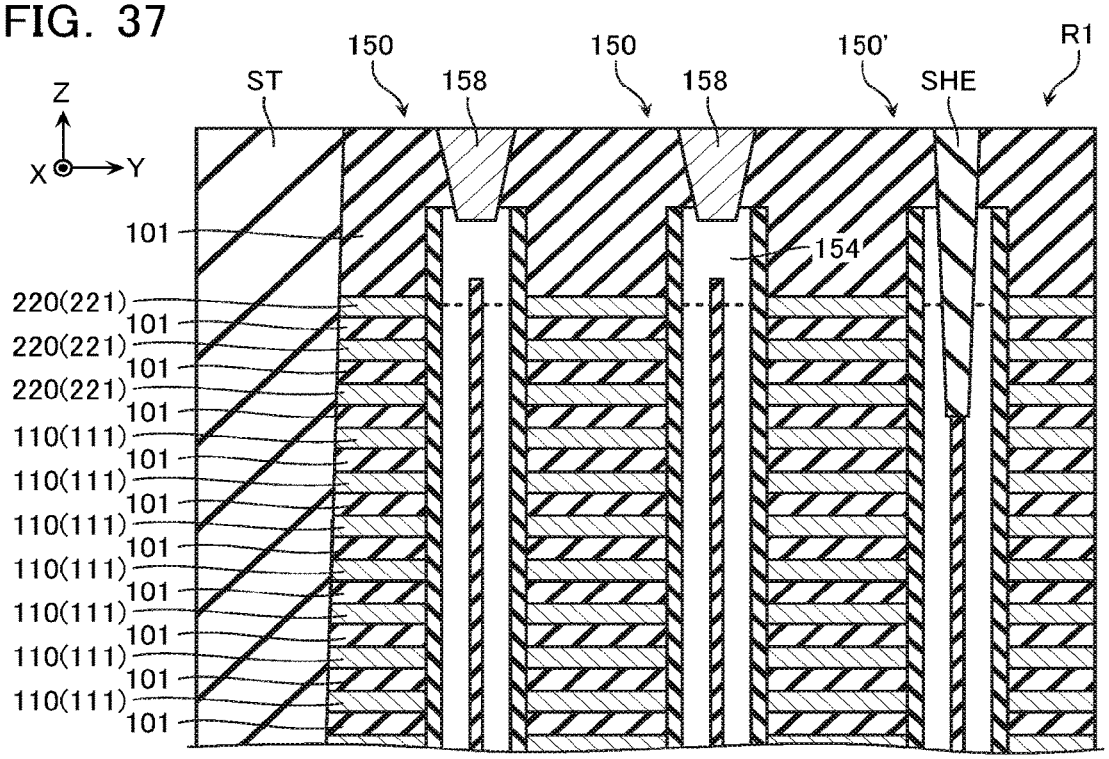
FIG. 37 is a schematic cross-sectional view of a semiconductor memory device according to a fourth embodiment.
Figure 38:
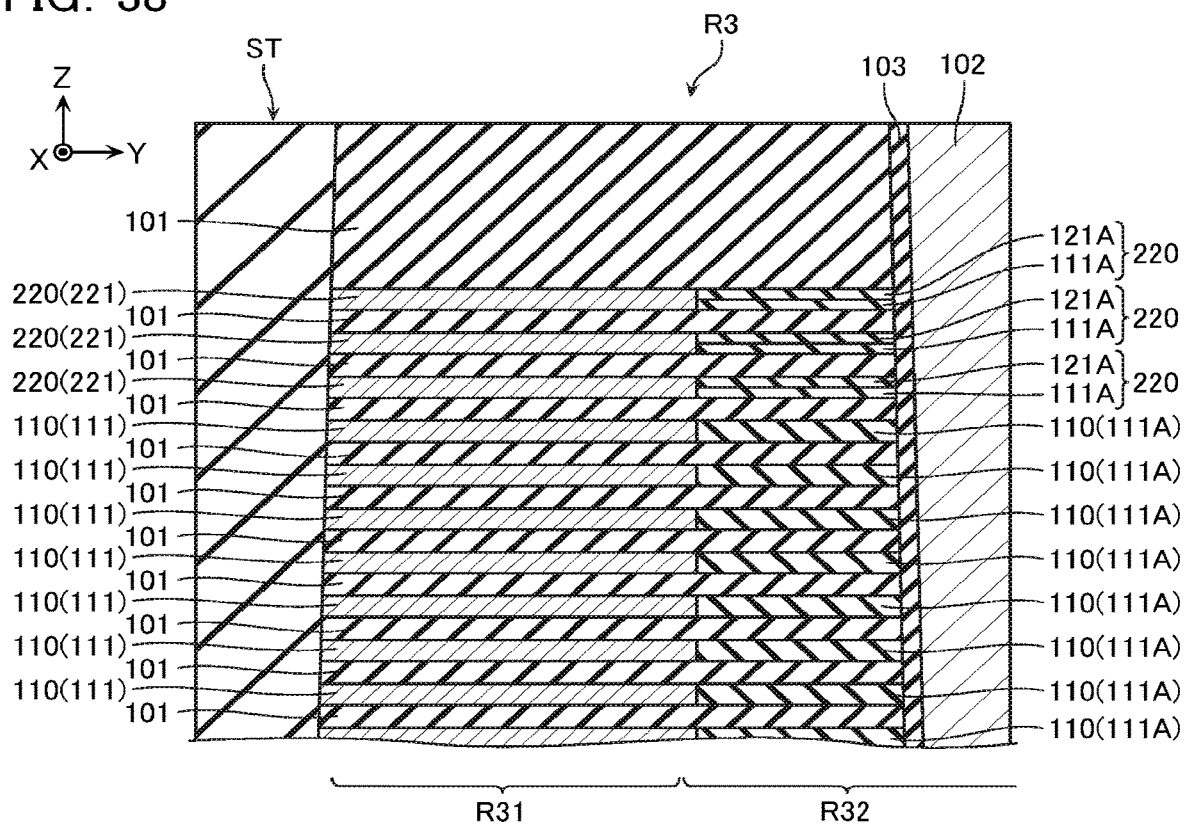
FIG. 38 is a schematic cross-sectional view of the semiconductor memory device according to the fourth embodiment.
Figure 39:
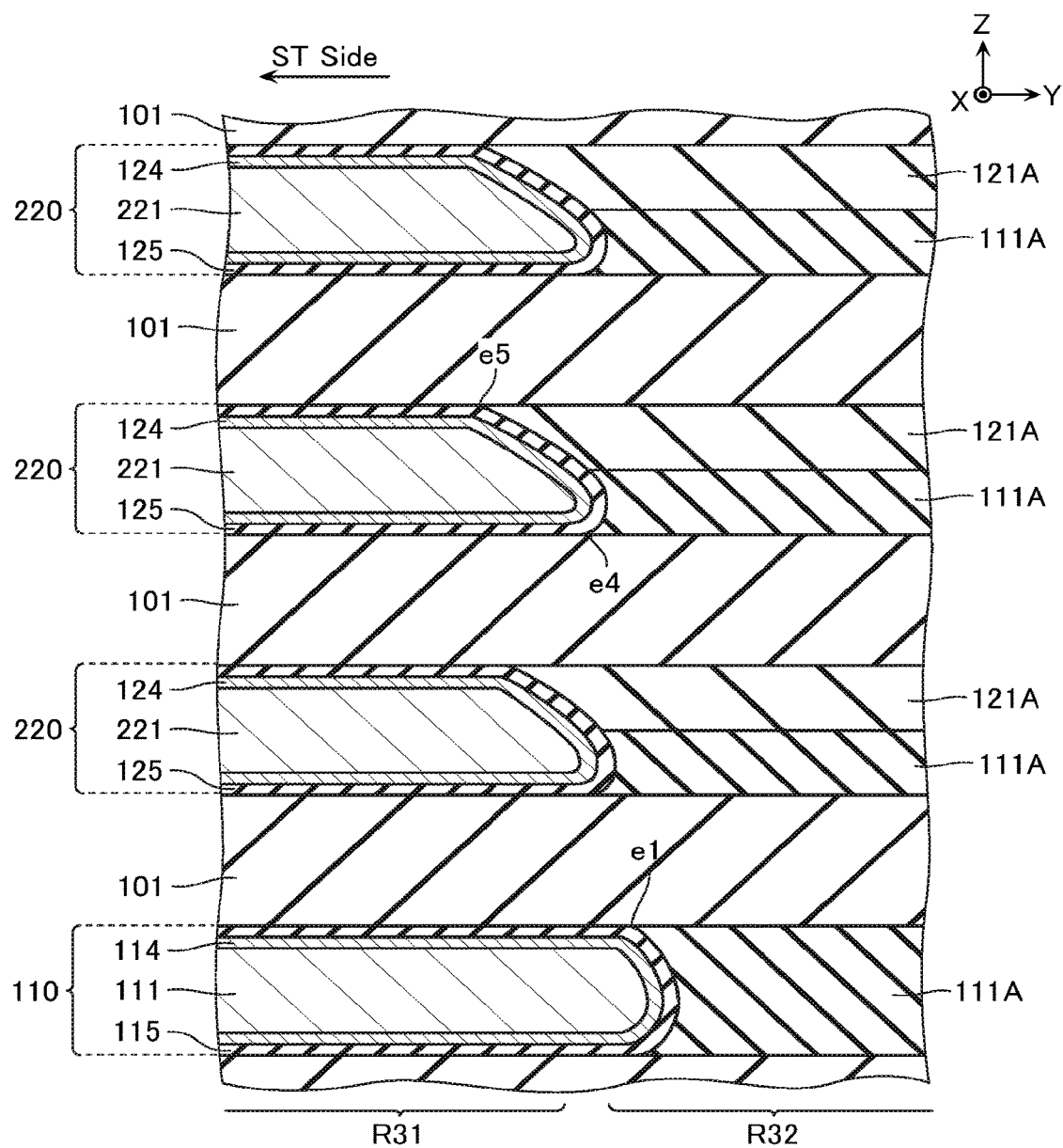
FIG. 39 is a schematic enlarged view of FIG. 38.

Next, with reference to FIG. 37 to FIG. 39, a semiconductor memory device according to the fourth embodiment is described. FIG. 37 to FIG. 39 are schematic cross-sectional views of the semiconductor memory device according to the embodiment. FIG. 37 illustrates a configuration in the region R1 (FIG. 3, FIG. 4), FIG. 38 illustrates a configuration in the region R3 (FIG. 3, FIG. 4), and FIG. 39 is an enlarged view of a part of FIG. 38. For sake of convenience of description, FIG. 37 to FIG. 39 omit a part of a configuration. In the following description, identical reference numerals are given to parts similar to those of the first embodiment to omit the description.

As illustrated in FIG. 37 and FIG. 38, the semiconductor memory device according to the embodiment is basically configured similarly to that of the first embodiment. Note that the semiconductor memory device according to the embodiment may include the wiring layer 120 or needs not to include the wiring layer 120. FIG. 37 and FIG. 38 illustrate contacts 158 connected to the semiconductor films 154.

As illustrated in FIG. 37 and FIG. 38, the semiconductor memory device according to the embodiment includes wiring layers 220 disposed upward with respect to the plurality of wiring layers 120.

As illustrated in FIG. 37, the wiring layer 220 includes a conductive film 221. In the example illustrated in the drawing, the conductive films 221 function as the drain select line SGD (FIG. 1) and gate electrodes of the plurality of drain select transistors STD (FIG. 1) connected to this drain select line SGD.

As illustrated in FIG. 38, the conductive films 221 are disposed in the wiring layers 220 in the region R31 where the distance from the insulating portion ST is equal to or less than the predetermined distance. On the other hand, the insulating films 111A and the insulating films 121A are disposed in the region R32. As illustrated in FIG. 39, the barrier metal film 124 and the high-dielectric insulating film 125 are disposed on the top surface, the lower surface, and the side surfaces of the conductive film 221 in the region R31. On the other hand, in the region R32, laminated films including the insulating films 121A of silicon nitride (SiN) or the like and the insulating films 111A disposed on the lower surfaces of these insulating films 121A are disposed. The top surface of the insulating film 121A and the lower surface of the insulating film 111A are in contact with the interlayer insulating films 101, and the side surfaces of these films are in contact with the high-dielectric insulating film 125.

In the example illustrated in FIG. 39, an end portion e1 on the insulating portion ST side of the insulating film 111A in the wiring layer 110 is far from the insulating portion ST with respect to an end portion e4 on the insulating portion ST side of the insulating film 111A in the wiring layer 220. This end portion e4 is far from the insulating portion ST with respect to an end portion e5 on the insulating portion ST side of the insulating film 121A in the wiring layer 220.

[Manufacturing Method]

Figure 40:
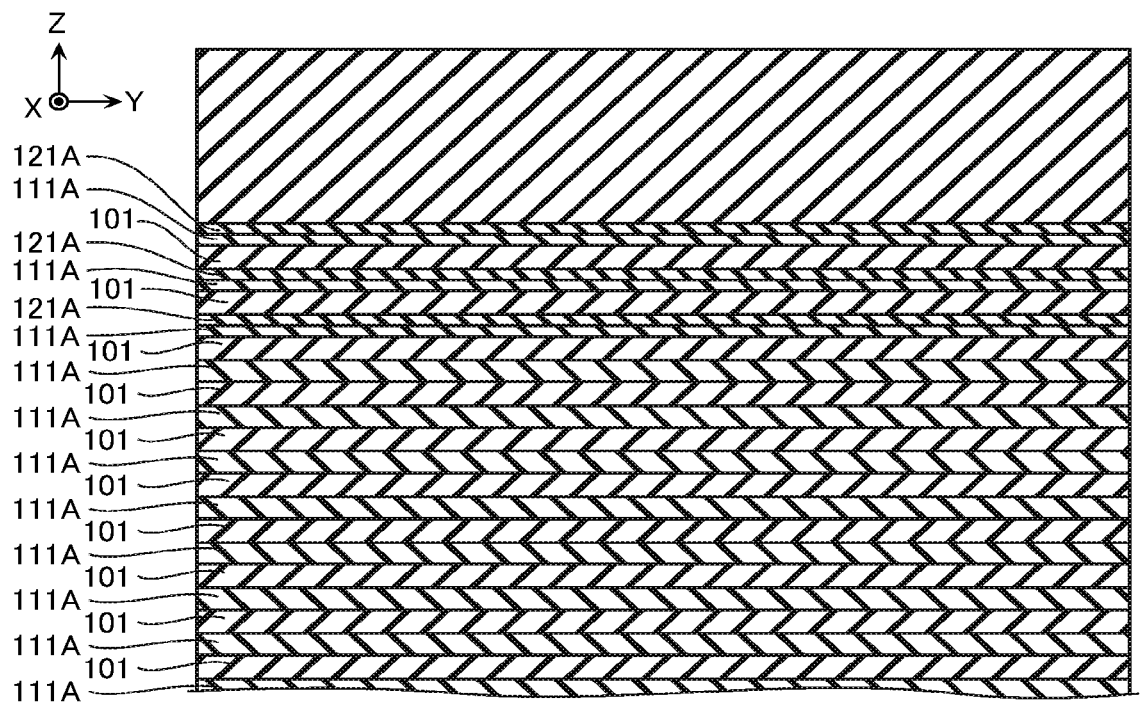
FIG. 40 is a schematic cross-sectional view illustrating a method for manufacturing the semiconductor memory device according to the fourth embodiment.

The semiconductor memory device according to the embodiment can be manufactured approximately similarly to the semiconductor memory device according to the first embodiment. Note that, as illustrated in FIG. 40, in the embodiment, after forming the plurality of interlayer insulating films 101 and insulating films 111A in alternation, the interlayer insulating films 101, the insulating films 111A, and the insulating films 121A are formed in order above the insulating film 111A.

[Advantages]

Figure 41:
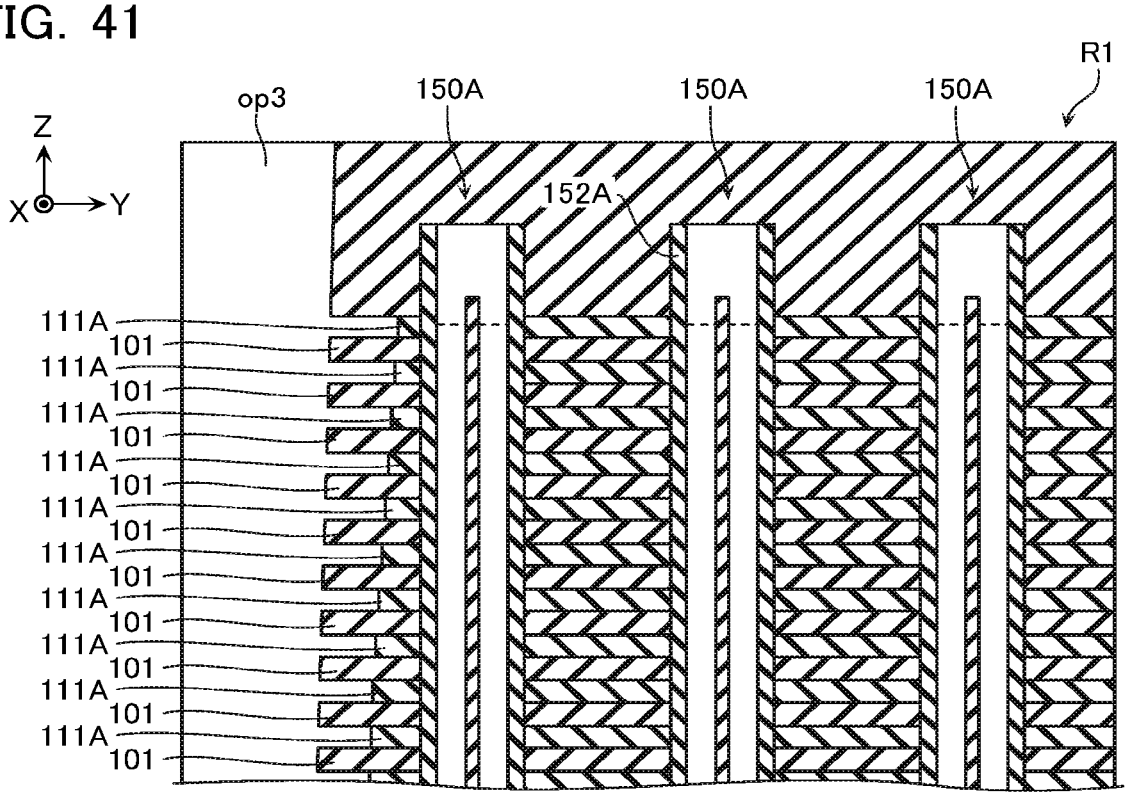
FIG. 41 is a schematic cross-sectional view illustrating a manufacturing method according to a comparative example.
Figure 42:
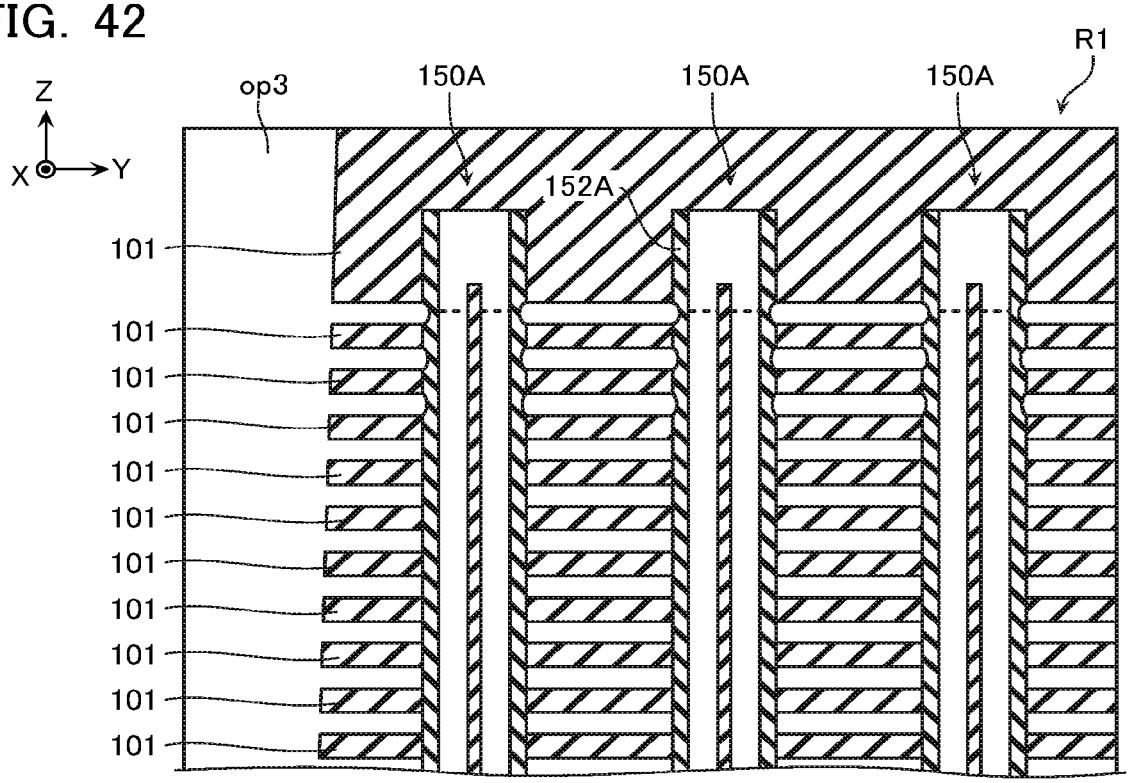
FIG. 42 is a schematic cross-sectional view illustrating the manufacturing method.

As described with reference to FIG. 27, in the manufacturing process of the semiconductor memory device according to the first embodiment, the insulating films 111A are removed. In this process, for example, as exemplified in FIG. 41, there may be a case where the insulating film 111A positioned on the upper layer is removed early. In such a case, from when the chemical solution is supplied until the insulating film 111A on the lowermost layer is removed, the upper portions of the laminated films 152A are exposed to the chemical solution for a long time, and, for example, as exemplified in FIG. 42, the upper portions of the laminated films 152A are deteriorated in some cases.

Figure 43:
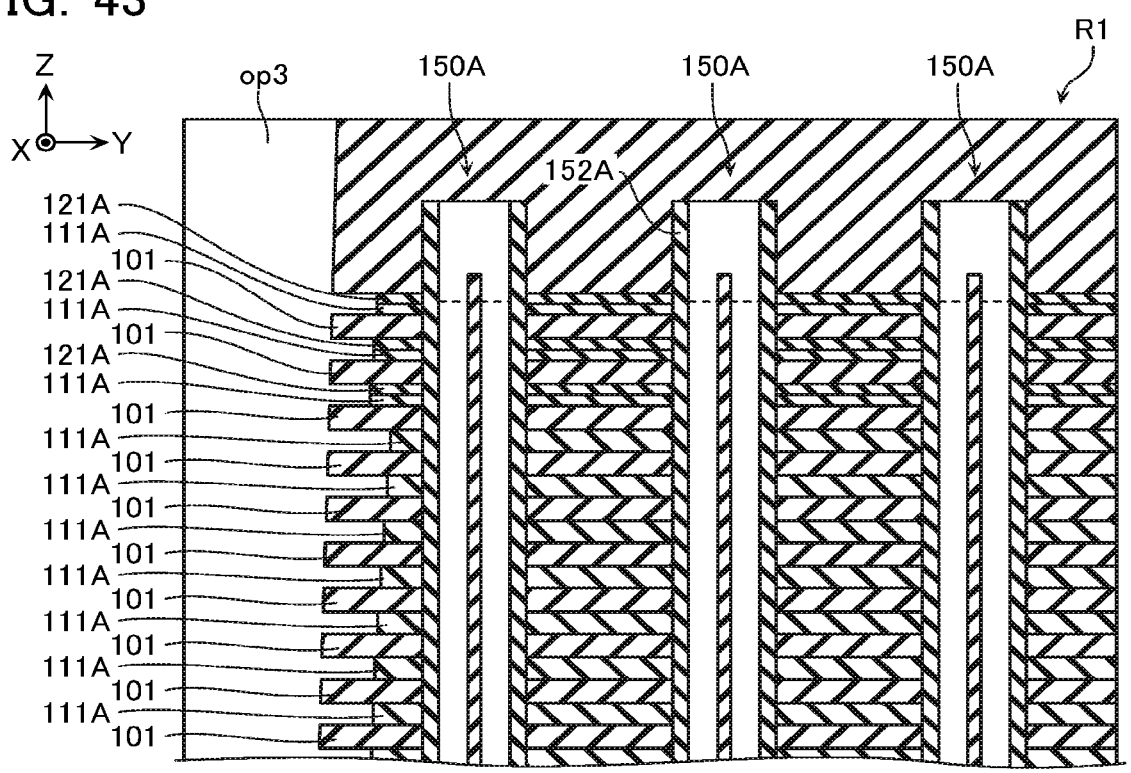
FIG. 43 is a schematic cross-sectional view illustrating the method for manufacturing the semiconductor memory device according to the fourth embodiment.

Therefore, in the embodiment, as described with reference to FIG. 40, after forming the plurality of interlayer insulating films 101 and insulating films 111A in alternation, the interlayer insulating films 101, the insulating films 111A, and the insulating films 121A are formed in order above the insulating film 111A. Here, as described above, the insulating film 121A, compared with the insulating film 111A, tends to have the smaller etching rate. Therefore, for example, as illustrated in FIG. 43, by exchanging the single layer films of the insulating films 111A for the laminated films of the insulating films 111A and the insulating films 121A, a speed that the insulating film 111A positioned on the upper layer is removed is reduced and the deterioration of the upper portions of the laminated films 152A can be reduced.

[Other Examples]

In the example of FIG. 38, the insulating films 121A and the insulating films 111A are disposed in the region R32 of the wiring layers 220. However, the insulating film 111A can be omitted in the region R32 of the wiring layer 220, and insertion of another film is also possible.

In the example of FIG. 38, the three layers of the wiring layers 220 are disposed above the plurality of wiring layers 110. However, the wiring layers 120 may be smaller than two layers or may be four layers or more.

In the example of FIG. 39, the thicknesses of all of the wiring layers 220 in the Z direction are identical to the thickness of the wiring layer 110 in the Z direction. However, the thicknesses of the wiring layers 220 in the Z direction may be different from the thickness of the wiring layer 110 in the Z direction.

Figure 44:
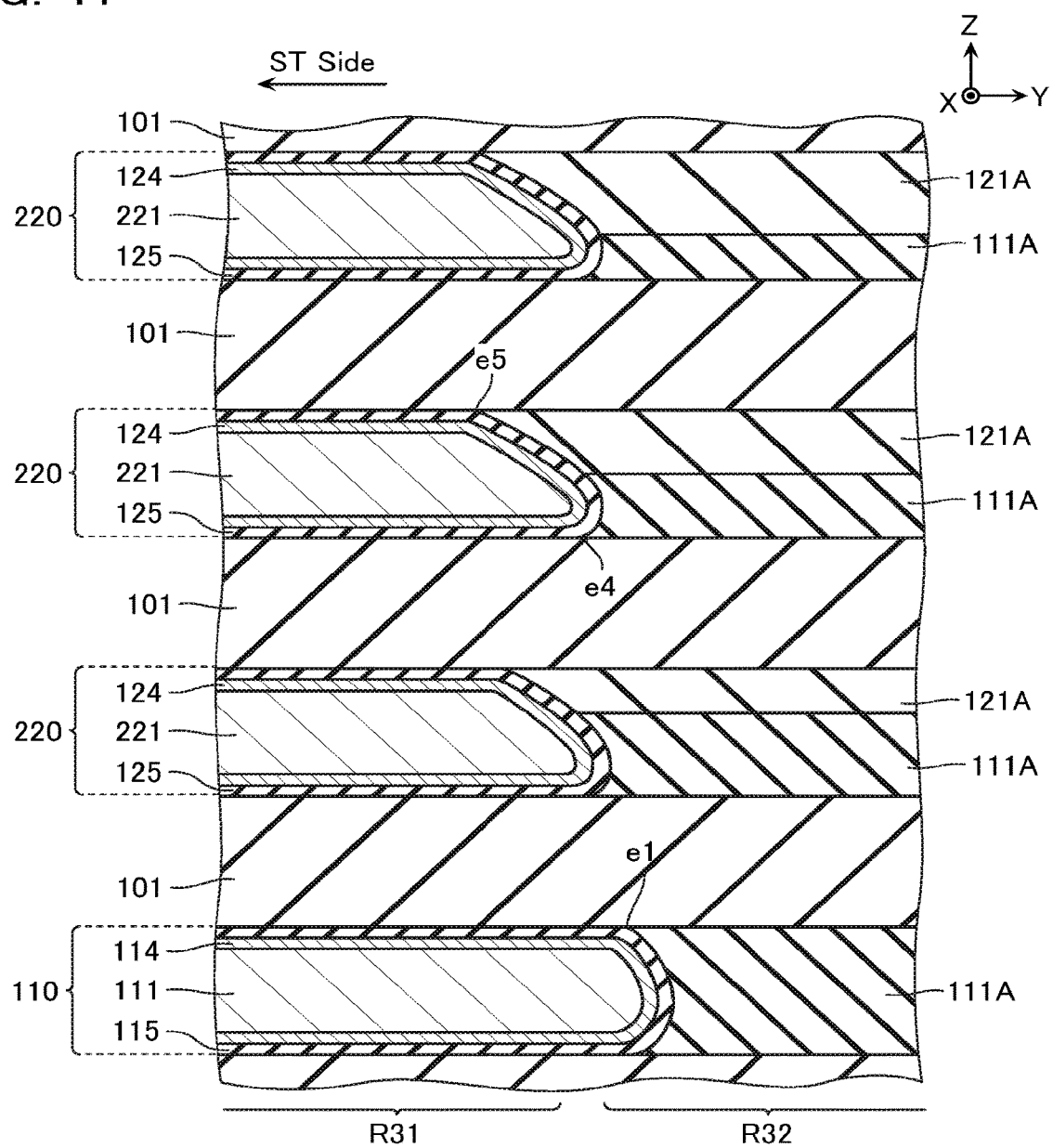
FIG. 44 is a schematic cross-sectional view illustrating another example of the semiconductor memory device according to the fourth embodiment.

Additionally, in the example of FIG. 39, in the plurality of wiring layers 220, the thicknesses of the insulating films 111A and the insulating films 121A in the Z direction are identical. However, for example, as illustrated in FIG. 44, in the wiring layer 220 positioned downward, a ratio of the insulating film 121A may be decreased, and in the wiring layer 220 positioned upward, a ratio of the insulating film 121A may be increased.

Figure 45:
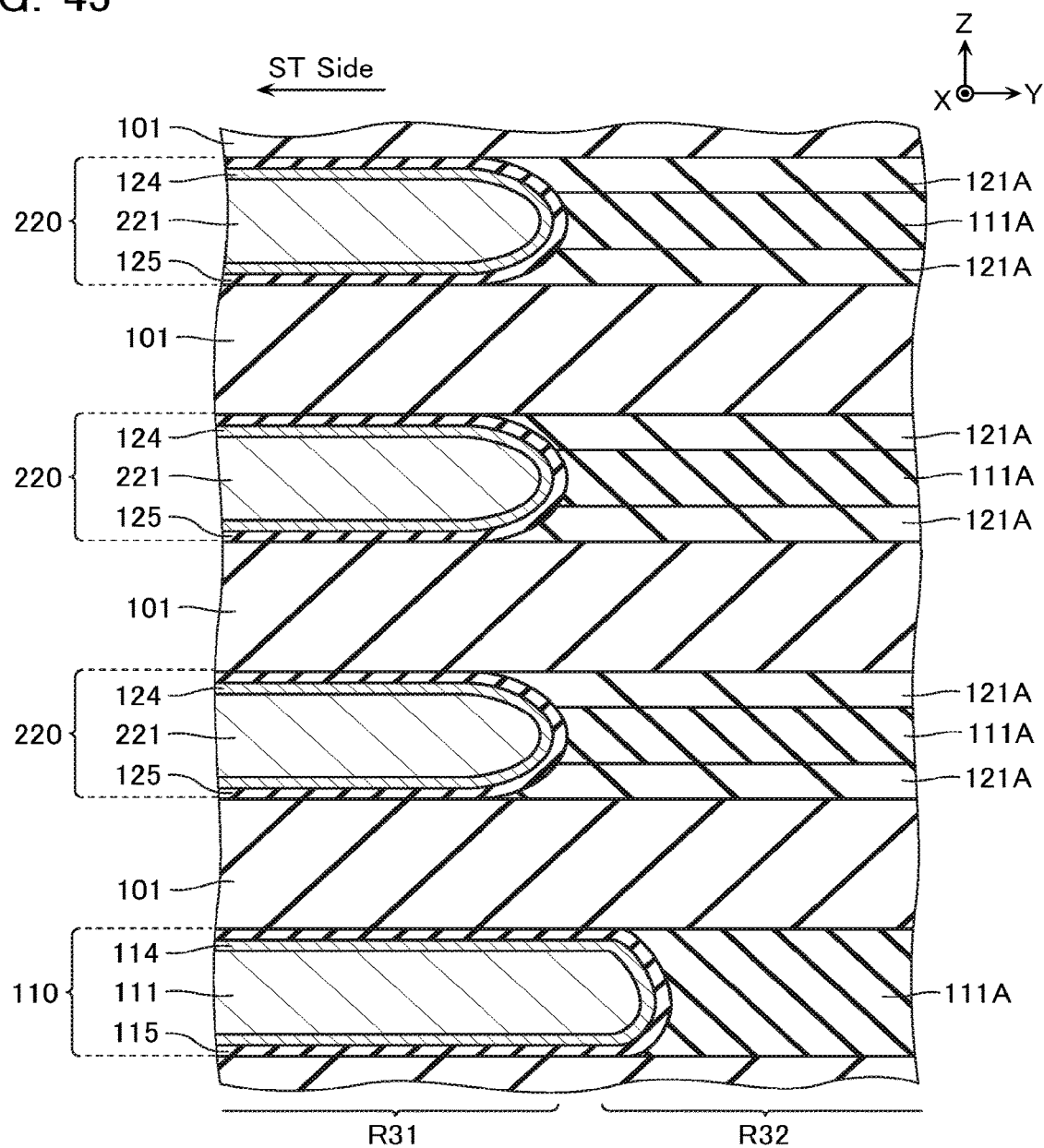
FIG. 45 is a schematic cross-sectional view illustrating another example of the semiconductor memory device according to the fourth embodiment.

In the example of FIG. 39, the insulating films 121A and the insulating films 111A are disposed by one layer in each wiring layer 220 in the region R32. However, for example, as illustrated in FIG. 45, for example, a laminated film including the two-layered insulating films 121A and the one-layered insulating film 111A disposed between these two-layered insulating films 121A may be disposed. Additionally, another laminated film may be disposed.

Figure 46:
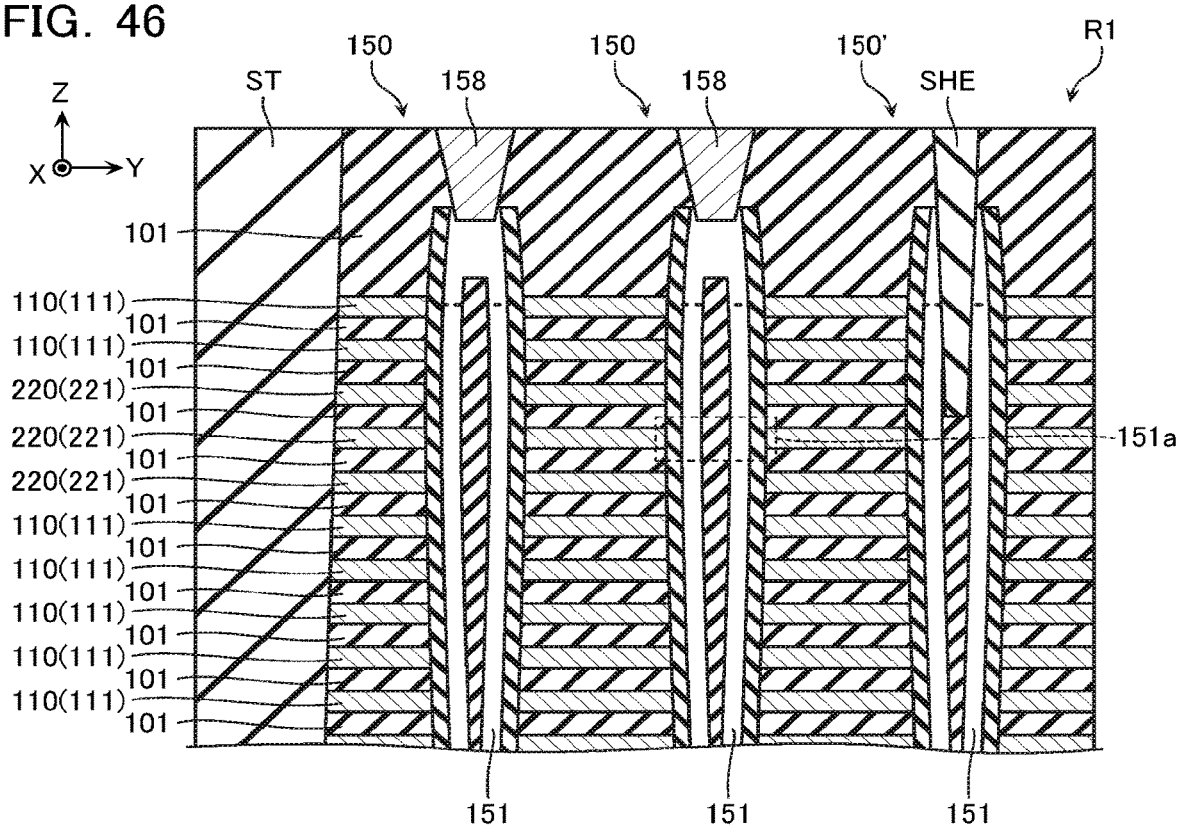
FIG. 46 is a schematic cross-sectional view illustrating another example of the semiconductor memory device according to the fourth embodiment.
Figure 47:
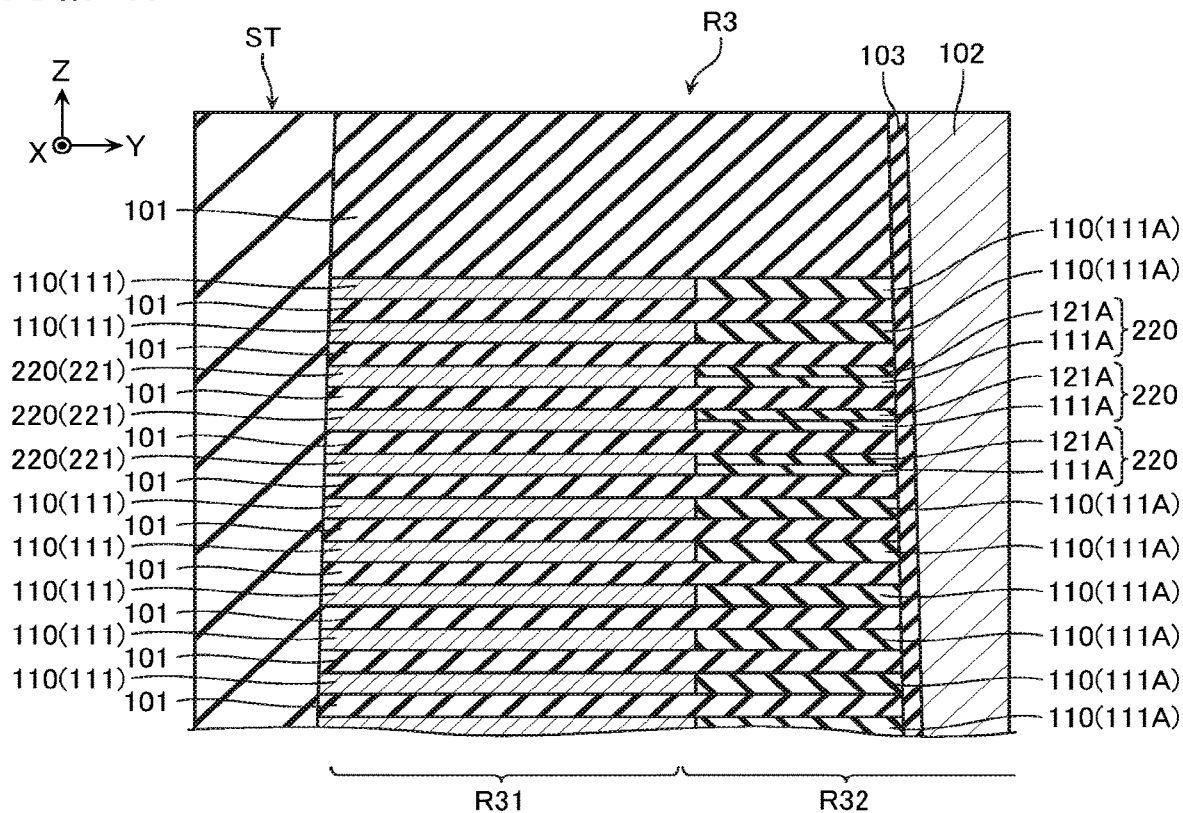
FIG. 47 is a schematic cross-sectional view illustrating another example of the semiconductor memory device according to the fourth embodiment.

Further, in the examples of FIG. 37 and FIG. 38, the wiring layers 220 are disposed above the plurality of wiring layers 110. However, for example, as illustrated in FIG. 46, there may be a case where an outer diameter of the semiconductor film 151 becomes the maximum or a local maximum size at a position away from the upper end of the semiconductor film 151. Hereinafter, a part where the outer diameter of the semiconductor film 151 becomes the maximum or local maximum size will be referred to as "first part 151a." When the semiconductor film 151 includes the first part 151a, for example, as illustrated in FIG. 46 and FIG. 47, one or a plurality of wiring layers 110 closest to this first part 151a may be exchanged for the wiring layer(s) 220. In this case, the conductive film 221 included in any of the wiring layers 220 or the interlayer insulating film 101 adjacent to any of the conductive films 221 in the Z direction is opposed to the first part 151a of the semiconductor film 151.

Other Embodiments

As described with reference to FIG. 2, in the first to the fourth embodiments, the circuit layer CL is disposed between the substrate S and the memory cell array layer ML. However, the circuit layer CL needs not to be disposed between the substrate S and the memory cell array layer ML. In this case, for example, the transistor and similar members constituting the peripheral circuit PC (FIG. 1) may be disposed in a region different from the regions R1, R2, and R3 (FIG. 3). In this case, for example, the contacts 102 (FIG. 4) in the region R3 may be omitted. In this case, for example, the structure in the staircase pattern as exemplified in FIG. 2 may be formed in the region R3. In a case of employing such structure in the first or the second embodiment, the insulating film 121A or 141F, which reduces the diffusion of hydrogen, may remain in the region R3.

The first and the second embodiment have exemplified the region R3, which has been described with reference to FIG. 3 and the like, as the region in which the insulating film 121A or 141F reducing the diffusion of hydrogen remains. However, the region in which the insulating film 121A or 141F remain may be a region other than the region R3.

To reduce the film peeling of the semiconductor film 141A caused by the diffusion of hydrogen, the film (121A, 141F, or 104) configured to reduce the diffusion of hydrogen only need to be disposed between the plurality of insulating films 111A and the plurality of interlayer insulating films 101 where hydrogen is generated and the semiconductor film 141A. As this specific example, the first embodiment has described the example of disposing the insulating film 121A in the wiring layer 120. The second embodiment has described the example of disposing the insulating film 141F in the wiring layer 140. Additionally, the third embodiment has described the example of disposing the insulating film 104 between the wiring layer 130 and the wiring layer 140. However, such films can be disposed in another part, for example, between the wiring layer 110 and the wiring layer 130 and the like. In this case, for example, the insulating laminated film 105 having the insulating property according to the third embodiment may be disposed between the wiring layer 110 and the wiring layer 130.

Among the insulating film 121A according to the first embodiment, the insulating film 141F according to the second embodiment, the insulating film 104 according to the third embodiment, the insulating film 121A according to the fourth embodiment, and a similar film, the use of two or more configurations in combination is also possible.

The insulating film 121A according to the first embodiment, the insulating film 141F according to the second embodiment, and the insulating film 104 according to the third embodiment all have been described with the example of silicon nitride or the like. However, as long as films can reduce the diffusion of hydrogen, these films need not to be the silicon nitride but may be, for example, alumina ($Al_2O_3$) or the like. As long as the films can reduce the diffusion of hydrogen, these films may be semiconductor films, conductive films, and the like, not the insulating films. However, similarly to the first embodiment and the second embodiment, in a case of the use of the film configured to reduce the diffusion of hydrogen as the sacrificial film, the etching rate of the sacrificial film in wet etching with predetermined chemical solution is preferably higher than the interlayer insulating film 101, and the etching rate of the sacrificial film in wet etching with another predetermined chemical solution is preferably lower than the interlayer insulating film 101. For example, the etching rate of hydrofluoric acid or the like of silicon oxide is larger than that of silicon nitride, and the etching rate of phosphoric acid or the like of silicon nitride is larger than that of silicon oxide.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
    a substrate that includes a first region and a second region;
    a plurality of first wiring layers disposed in a first direction intersecting with a surface of the substrate;
    a second wiring layer having a distance from the substrate different from distances of the plurality of the first wiring layers from the substrate;
    a third wiring layer close to the substrate with respect to the plurality of the first wiring layers and the second wiring layer;
    a semiconductor film that penetrates the plurality of the first wiring layers and the second wiring layer, extends in the first direction, and is connected to the third wiring layer; and
    a gate insulating film disposed between the semiconductor film and the plurality of the first wiring layers, wherein
    the plurality of the first wiring layers include first conductive films opposed to the semiconductor film in the first region, and the plurality of the first wiring layers include first films different from the first conductive films in the second region,
    the second wiring layer includes a second conductive film opposed to the semiconductor film in the first region, and the second wiring layer includes a second film different from the second conductive film in the second region,
    the second film is different from the first films, and
    the second film has at least one of:
        a density larger than densities of the first films;
        a content rate of hydrogen smaller than content rates of hydrogen of the first films; and
        an etching rate of a first chemical solution smaller than etching rates of the first chemical solution of the first films.

2. The semiconductor memory device according to claim 1, further comprising
    an interlayer insulating film disposed between the plurality of the first wiring layers, wherein
    the interlayer insulating film has:
        an etching rate of the first chemical solution smaller than the etching rate of the first chemical solution of the second film; and
        an etching rate of a second chemical solution larger than an etching rate of the second chemical solution of the second film.

3. The semiconductor memory device according to claim 1, wherein
    the second wiring layer further includes one of the first films in the second region.

4. The semiconductor memory device according to claim 1, wherein
    the first films and the second film contain nitrogen.

5. The semiconductor memory device according to claim 1, wherein
    the second wiring layer is close to the substrate with respect to the plurality of the first wiring layers.

6. The semiconductor memory device according to claim 1, wherein
    the second wiring layer is far from the substrate with respect to the plurality of the first wiring layers.

7. The semiconductor memory device according to claim 1, wherein
    the semiconductor film includes a first part where a width in a second direction intersecting with the first direction becomes a maximum or a local maximum, and
    the first part of the semiconductor film is opposed to the second conductive film or an interlayer insulating film adjacent to the second conductive film in the first direction.

8. The semiconductor memory device according to claim 1, further comprising
    a plurality of the second wiring layer disposed in the first direction.

9. The semiconductor memory device according to claim 8, wherein
    the plurality of the second wiring layer includes a plurality of the second films, and thicknesses in the first direction of the plurality of the second films are different from each other.

10. The semiconductor memory device according to claim 1, wherein
    the third wiring layer includes a laminated film having a conductive property.

* * * * *